US007871938B2

(12) United States Patent
Ozaki et al.

(10) Patent No.: US 7,871,938 B2
(45) Date of Patent: Jan. 18, 2011

(54) PRODUCING METHOD OF SEMICONDUCTOR DEVICE AND SUBSTRATE PROCESSING APPARATUS

(75) Inventors: Takashi Ozaki, Toyama (JP); Kazuhiro Yuasa, Takaoka (JP); Kiyohiko Maeda, Imizu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/403,974

(22) Filed: Mar. 13, 2009

(65) Prior Publication Data

US 2009/0239387 A1    Sep. 24, 2009

Related U.S. Application Data

(62) Division of application No. 10/549,938, filed as application No. PCT/JP2004/012214 on Aug. 25, 2004, now Pat. No. 7,534,730.

(30) Foreign Application Priority Data

Aug. 26, 2003    (JP) .............................. 2003-301982

(51) Int. Cl.
*H01L 21/31* (2006.01)
*H01L 21/469* (2006.01)

(52) U.S. Cl. ............... 438/770; 438/765; 257/E21.285; 257/E21.552; 118/719

(58) Field of Classification Search ................ 428/765, 428/773, 770; 257/E21.285, E21.013, E21.552, 257/E21.284, E21.288, E21.282, E21.283; 118/719

See application file for complete search history.

(56) References Cited

U.S. PATENT DOCUMENTS

| 5,648,282 | A | * | 7/1997 | Yoneda ........................ 438/305 |
| 6,074,486 | A | * | 6/2000 | Yang et al. ................... 118/719 |
| 6,599,845 | B2 | * | 7/2003 | Sato et al. .................... 438/770 |
| 6,869,892 | B1 | | 3/2005 | Suzuki et al. |
| 7,534,730 | B2 | * | 5/2009 | Ozaki et al. .................. 438/770 |
| 2007/0157882 | A1 | | 7/2007 | Ozaki et al. |

FOREIGN PATENT DOCUMENTS

| EP | 1152461 A2 | 11/2001 |
| JP | 01-30234 A | 2/1989 |
| JP | 02-28928 A | 1/1990 |
| JP | 9-134913 A | 5/1997 |
| JP | 11-121389 A | 4/1999 |
| JP | 11-204511 | 7/1999 |
| JP | 3242244 B2 | 10/2001 |
| JP | 2002-176052 A | 6/2002 |
| JP | 2003-100735 A | 4/2003 |
| JP | 4164092 B2 | 8/2008 |

* cited by examiner

*Primary Examiner*—Caridad M Everhart
(74) *Attorney, Agent, or Firm*—Birch, Stewart, Kolasch & Birch, LLP

(57) ABSTRACT

Disclosed is a producing method of a semiconductor device produced by transferring a plurality of substrates into a processing chamber, supplying oxygen-containing gas and hydrogen-containing gas into the processing chamber which is in a heated state to process the plurality of substrates by oxidation, and transferring the plurality of the oxidation-processed substrates out from the processing chamber, wherein the hydrogen-containing gas is supplied from a plurality of locations of a region corresponding to a substrate arrangement region in which the plurality of substrates are arranged in the processing chamber.

18 Claims, 21 Drawing Sheets

PRODUCING METHOD OF SEMICONDUCTOR DEVICE AND SUBSTRATE PROCESSING APPARATUS

This application is a Divisional of application Ser. No. 10/549,938 filed on Jan. 3, 2007 now U.S. Pat. No. 7,534,730 and for which priority is claimed under 35 U.S.C. §120. Application Ser. No. 10/549,938 claims foreign priority under 35 U.S.C. §119(a)-(d) to Application No. JP 2003-301982. Application No. JP 2003-301982 is the national phase of PCT International Application No. PCT/JP2004/012214 filed on Aug. 25, 2004 under 35 U.S.C. §371. The entire contents of each of the above-identified applications are hereby incorporated by reference.

TECHNICAL FIELD

The present invention relates to a producing method of a semiconductor device and a substrate processing apparatus, and more particularly, to a producing method of a semiconductor device having a step for subjecting a surface of a substrate such as a semiconductor wafer to oxidation processing, and to a substrate processing apparatus suitable used for the producing method.

BACKGROUND ART

In a step for allowing oxidation reaction to take place directly on an Si substrate (wafer) which is formed in the course of semiconductor process, and from which different Si crystal planes are exposed, in a conventional oxidation technique, oxidation speed is different depending upon crystal plane. As a result, there is a problem that an oxide film having uneven film thickness is formed on a substrate, and characteristics are varied depending upon location on the substrate.

As a step in which different Si crystal planes are exposed from a substrate, there is element-isolation known as Shallow Trench Isolation (STI), and a forming step of a vertical type MOS transistor in which an Si substrate is embedded. By forming a groove on the Si substrate by dry etching, different surface orientations are exposed from a side surface and a bottom surface of the groove. In the STI step, $Si_3N_4$ is exposed from the substrate surface by the oxidation step, and it is required to bring oxidation speed on the $Si_3N_4$ closer to oxidation speed on the Si substrate, and to obtain the same oxide film thicknesses as close as possible.

As conventional oxidation methods, there are a dry oxidation method and a wet oxidation method. In the dry oxidation method, the pressure of atmosphere in a reaction chamber is set to normal pressure or vacuum pressure, and oxidation processing of a substrate is carried out in atmosphere in which oxygen partial pressure is adjusted by means of oxygen alone, or $N_2$, Ar and the like. In the wet oxidation method, oxidation processing of a substrate is carried out utilizing moisture formed by mixing oxygen and hydrogen with each other in a front stage of a reaction chamber. As a method for forming moisture by mixing hydrogen and oxygen with each other, there are widely utilized a method in which temperature is increased to ignition temperature of hydrogen and oxygen or higher by resistance heating or lamp light-gathering heating to burn, and a method in which hydrogen and oxygen are allowed to react with each other by catalysis at ignition temperature or lower (see Japanese Patent Application Laid-open No. H11-204511).

According to the conventional oxidation method, oxidation speed of (110) plane having greater Si atom surface density becomes two times greater than that of (100) plane in a thin film oxidation region depending upon Si atom surface density of a surface of an Si substrate between surface orientations of different Si substrates, e.g., between the (100) plane and the (110) plane. Further, oxidation resistance is high on an $Si_3N_4$, the $Si_3N_4$ is used as a barrier layer against oxidation, and oxidation does not proceed almost at all.

DISCLOSURE OF THE INVENTION

It was found that if oxygen and hydrogen were independently introduced into a reaction chamber having vacuum atmosphere from independent gas supply systems, growing speed at initial stage of oxidation was fast, a difference in growing speeds between surface orientations of different Si substrates, and a difference between growing speed of the Si substrate and growing speed on the $Si_3N_4$ were reduced and as a result, a difference in film thickness could remarkably be reduced, and isotropic oxidation could be carried out.

When isotropic oxidation is to be carried out by a batch type vertical apparatus, however, there is a problem that if gas is supplied from only an upper portion which is upstream of substrates which are subjects to be processed, hydrogen concentration is varied due to disposition locations of the substrates multi-stacked in the vertical direction, and thicknesses of the formed oxide films are largely varied.

When isotropic oxidation is carried out by an apparatus in which a plurality of substrates are stacked on one another, it is a main object of the present invention to provide a producing method of a semiconductor device capable of producing high quality semiconductor device while suppressing a case in which hydrogen concentration is varied depending upon the disposition locations of the substrates and oxide film thicknesses are largely varied, and to provide a substrate processing apparatus that can suitably be used for the producing method.

According to an aspect of the present invention, there is provided a producing method of a semiconductor device, characterized by comprising:

a step for transferring a plurality of substrates into a processing chamber;

a step for supplying oxygen-containing gas from upstream of said plurality of substrates transferred into said processing chamber;

a step for supplying hydrogen-containing gas from at least one half-way location corresponding to a region where said plurality of substrates transferred into said processing chamber exist;

a step for allowing said oxygen-containing gas and hydrogen-containing gas to react with each other in said processing chamber to oxidize said plurality of substrates; and a step for transferring said processed substrates out from said processing chamber.

According to another aspect of the present invention, there is provided a substrate processing apparatus, characterized by comprising:

a processing chamber which processes a plurality of substrates;

a holding tool which holds said plurality of substrates in said processing chamber;

an oxygen-containing gas supply line which supplies oxygen-containing gas to said plurality of substrates from upstream of said plurality of substrates;

a hydrogen-containing gas supply line which supplies hydrogen-containing gas to said substrates from at least one half-way location corresponding to a region where said plurality of substrates exists; and an exhaust line which exhaust inside of said processing chamber.

BRIEF DESCRIPTION OF THE FIGURES IN THE DRAWINGS

PREFERABLE MODE FOR CARRYING OUT THE INVENTION

The present inventors found that if oxygen and hydrogen were introduced into a pressure-reduced reaction chamber, isotropic oxidation can be carried out, and its film forming speed is supply rate-determining reaction of hydrogen, and the inventors devised that two or more hydrogen supply passages are brought into communication with the reaction chamber so as to constantly set forming speed of films on substrates stacked on one another in the vertical direction. With this, it is possible to eliminate attenuation of hydrogen concentration in downstream direction of gas flow in the reaction chamber that is caused when hydrogen supplied from upstream of the reaction chamber reacts with oxygen supplied from upstream of the reaction chamber and is consumed. The present inventors succeeded in enhancing the consistency of thicknesses of oxide films on a plurality of substrates when isotropic oxidation is carried out using a batch type vertical apparatus.

Embodiments of the present invention will be explained with reference to the drawings.

Embodiment 1

Figure 1:
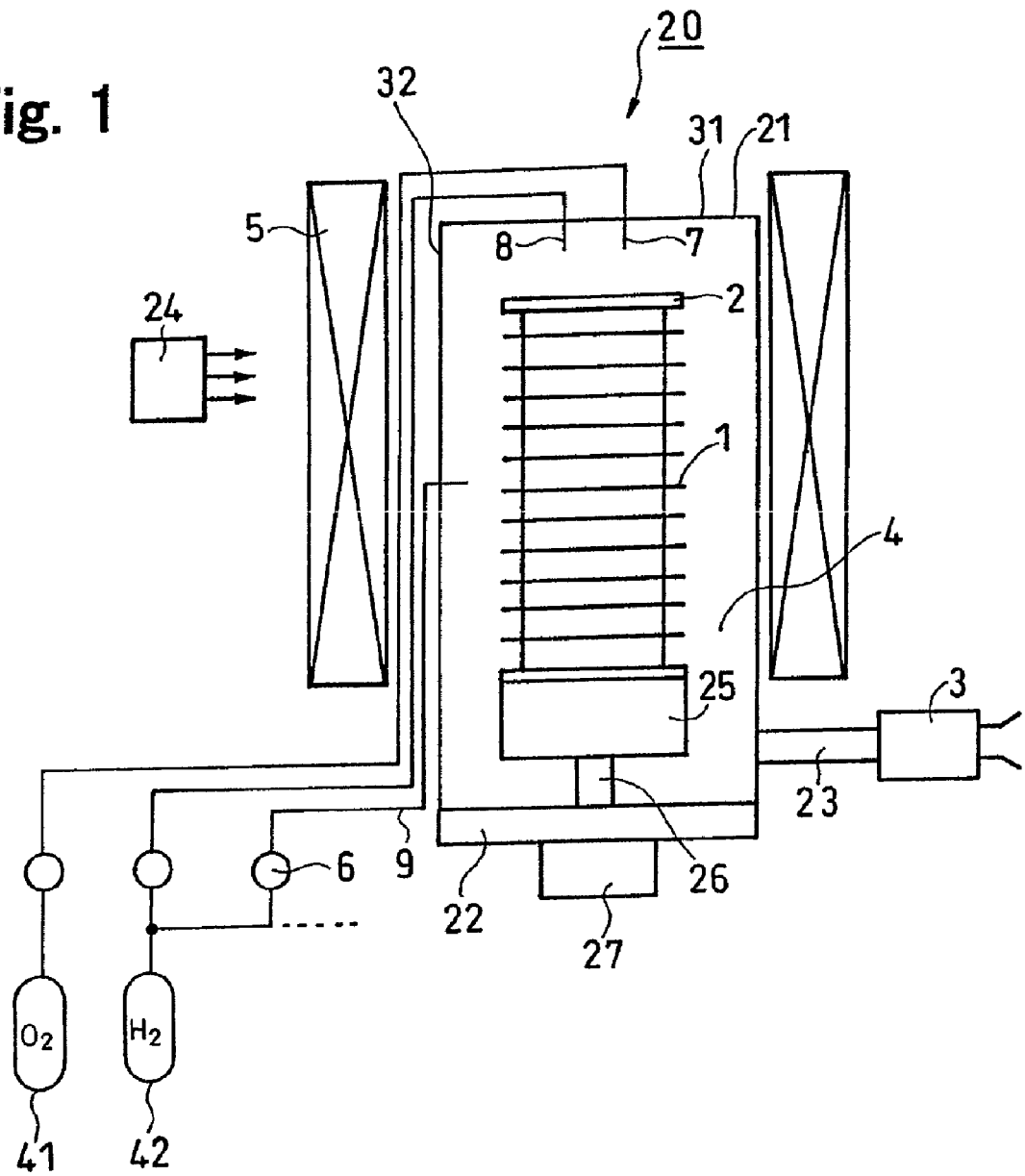
FIG. 1 is a schematic longitudinal sectional view for explaining a substrate processing apparatus according to an embodiment 1 of the present invention.

With reference to FIG. 1, a substrate processing apparatus and a batch type vertical semiconductor producing apparatus (oxidation apparatus) of this embodiment will be explained. A reaction furnace 20 includes a reaction tube 21. A boat 2 as a substrate holding tool is inserted into are action chamber (processing chamber) 4 formed by the reaction tube 21. The holding tool 2 holds a plurality of semiconductor wafers (silicon wafers) 1 as substrates in a multi-stacked manner in their horizontal attitudes at gaps (substrate pitch distances) from one another. A lower portion of the reaction tube 21 is opened so that the holding tool 2 is inserted thereinto, and this opening is tightly closed with a seal cap 22. The holding tool 2 is mounted on a heat insulation cap 25. The heat insulation cap 25 is mounted on a rotation mechanism 27 through a rotation shaft 26. A resistance heater 5 as a heat source is disposed around the reaction tube 21. Connected to the reaction tube 21 are oxygen supply line 7 which supplies oxygen ($O_2$) gas as oxygen-containing gas to substrates 1 from upstream thereof, a hydrogen supply line 8 which supplies hydrogen ($H_2$) gas as hydrogen-containing gas to the substrates 1 from the upstream thereof, and a hydrogen supply line 9 which supplies hydrogen ($H_2$) gas as hydrogen-containing gas to the substrates 1 from an intermediate location corresponding to a region where the plurality of substrates 1 exist. It is preferable to provide a plurality of hydrogen supply lines 9. The oxygen supply line 7 is connected to an oxygen gas supply source 41, and the hydrogen supply lines 8 and 9 are connected to a hydrogen gas supply source 42. The oxygen supply line 7 and the hydrogen supply line 8 penetrate a ceiling wall 31 of the reaction tube 21. Gas jet openings are directed downward, and oxygen gas and hydrogen gas are issued downward from the gas jet openings. The hydrogen supply line 9 penetrates a sidewall 32 of the reaction tube 21. A gas jet opening is directed in the horizontal direction, and hydrogen gas is issued toward the wafers from the gas jet opening. The supply lines 7, 8 and 9 are respectively provided with solenoid valves 6 for supplying gas and stopping the supply of gas. An exhaust line 23 is connected to the reaction tube 21 for exhausting process gas, and a vacuum pump 3 is connected to the exhaust line 23. During the processing of the substrates, the pressure in the reaction tube 21 is brought into a predetermined pressure (vacuum) lower than the atmospheric pressure by the vacuum pump 3, and control means 24 controls the pressure.

Next, a method for subjecting the substrates to the oxidation processing as one step of a producing step of the semiconductor device using the above-described oxidation apparatus will be explained.

If one batch of wafers 1 is transferred to the holding tool 2, the holding tool 2 in which the plurality of wafers 1 are loaded is loaded into a processing chamber 4 of the reaction furnace 20 whose heated state is maintained by the heat source 5, and the reaction tube 21 is tightly closed with the seal cap 22. The reaction tube 21 is evacuated from the vacuum pump 3, and the control means 24 controls such that the pressure in the furnace becomes equal to predetermined processing pressure which is lower than the atmospheric pressure. The rotation mechanism 27 rotates the boat 2 at a predetermined rotation speed. The temperature in the furnace is increased, and the control means 24 controls the temperature in the furnace becomes equal to the predetermined processing temperature. Thereafter, the oxygen supply line 7 supplies oxygen into the processing chamber 4, the hydrogen supply line 8 and the hydrogen supply line 9 supply hydrogen gas into the processing chamber 4. With this, oxygen gas and hydrogen gas react with each other in the atmosphere heated by the heat source 5, reaction species are generated, and the wafers 1 are subjected to the oxidation processing by the reaction species. Examples of the processing temperature are 500 to 1000° C., and examples of the processing pressure are 1 to 1000 Pa.

If the oxidation processing of wafers 1 is completed, residual gas is eliminated by purge using evacuation or inert gas, the temperature in the furnace is reduced to a predetermined temperature and then, the holding tool 2 is unloaded from the reaction furnace 20, and the holding tool 2 is brought into a standby state until all of the wafers 1 supported by the holding tool 2 are cooled. When the wafers 1 held by the holding tool 2 which is in the standby state are cooled to a predetermined temperature, the wafers are collected by a substrate transfer device or the like.

According to this embodiment, a difference in growing speeds of oxide films on silicon surfaces of different surface orientations on wafer substrates formed through a process step of various semiconductor wafers can largely be reduced as compared with the conventional oxidation method (dependence on surface orientation of processed wafer can be reduced). In addition, when a plurality of wafers are to be processed by a vertical substrate processing apparatus, it is possible to suppress the variation in oxide film thicknesses which might be caused due to variation in hydrogen concentration on each wafer. The present invention is especially effective when surfaces of a substrates which are subjected to oxidation processing have different crystal orientation surfaces, or polycrystalline silicon by CVD or a silicon nitride.

Although a case in which oxygen gas is used as the oxygen-containing gas, and a case in which hydrogen gas is used as the hydrogen-containing gas are explained in the above embodiment, at least one of gasses selected from a group comprising oxygen ($O_2$) gas and nitrous oxide ($N_2O$) gas can be used as the oxygen-containing gas, and at least one of gasses selected from a group comprising hydrogen ($H_2$) gas, ammonia ($NH_3$) and gas and methane ($CH_4$) gas can be used as the hydrogen-containing gas.

Embodiment 2

Figure 2:
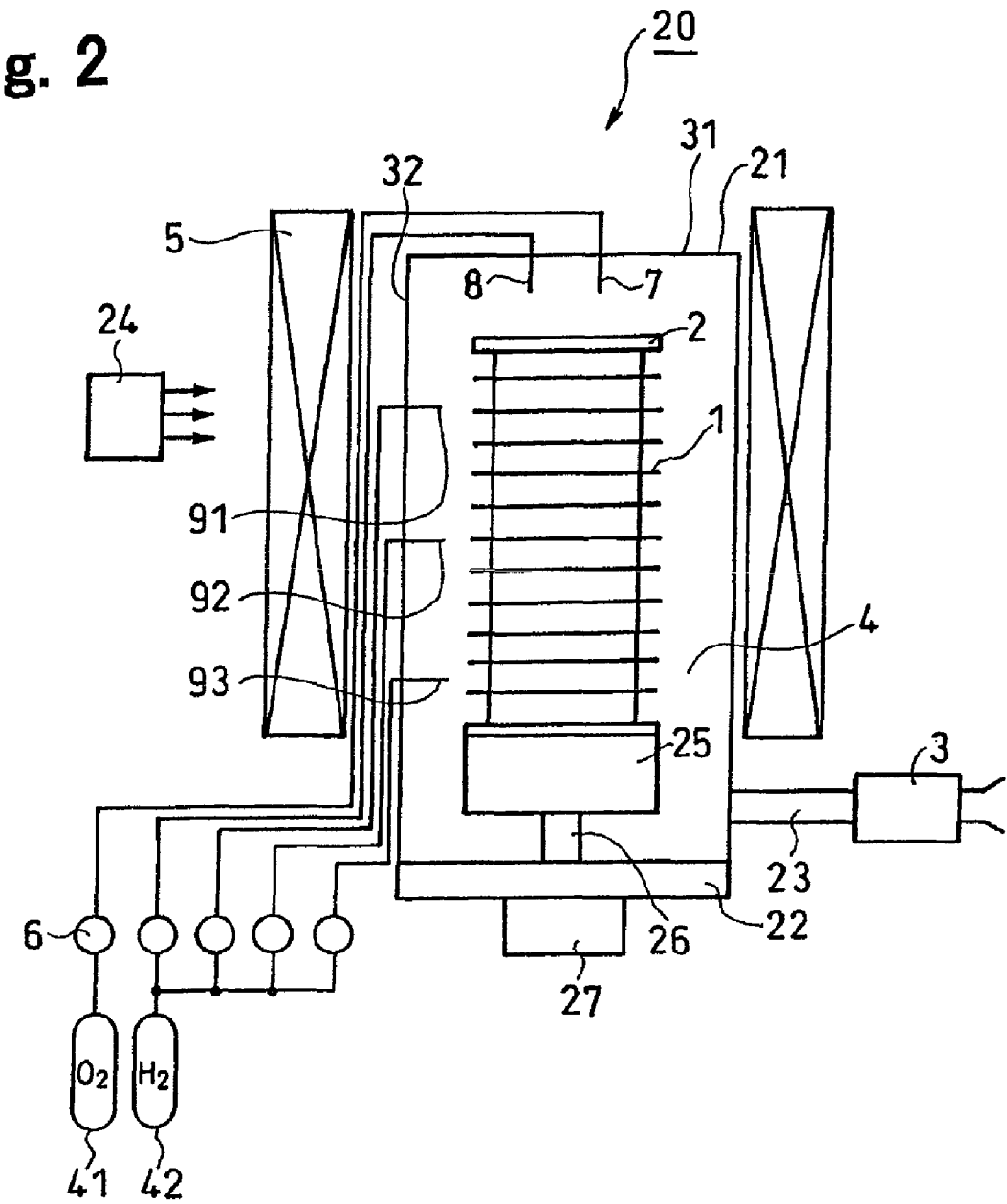
FIG. 2 is a schematic longitudinal sectional view for explaining a substrate processing apparatus according to an embodiment 2 of the present invention.

Next, a substrate processing apparatus of the embodiment 2 will be described in detail with reference to FIG. 2.

The pressure in the reaction chamber 4 is reduced through the vacuum pump 3. The oxygen supply line 7 and the hydrogen supply line 8 which are independent from each other are connected to the reaction chamber 4. Oxygen gas and hydrogen gas are not mixed with each other before they are supplied to the reaction chamber 4, and active hydrogen and oxygen react with each other in the atmosphere heated by the heat source 5. Therefore, oxidation speed can be increased in the initial stage of oxidation.

The acceleration of the oxidation speed depends on hydrogen concentration in the vicinity of the wafers. In a structure in which hydrogen gas is supplied only through the hydrogen supply line 8 from upstream of an arrangement of the wafers 1, hydrogen gas contributes to the oxidation reaction and with this, the hydrogen gas is consumed toward the downstream of the arrangement of the wafers, the hydrogen gas concentration is different depending upon the disposition location of the wafer and as a result, film thickness consistency is largely deteriorated.

To compensate a deficiency of hydrogen gas which is consumed by the oxidation reaction and depleted downstream, a plurality of hydrogen supply lines 91, 92 and 93 are provided as supply lines of hydrogen, in addition to the hydrogen supply line 8. With this, it is possible to supply hydrogen gas to substrates from a plurality of locations on the way to a region where the plurality of wafers 1 exist. Therefore, it is possible to improve the film thickness consistency of the plurality of wafers 1 disposed in the reaction chamber 4. The hydrogen supply lines 91, 92 and 93 are independent from each other, and penetrate the sidewall 32 of the reaction tube 21. Gas jet openings of the hydrogen supply lines 91, 92 and 93 are directed toward the wafers (opposed to the wafers 1), and the gas jet opening can supply hydrogen to locations in the vicinity of the wafers. The hydrogen supplied from the hydrogen supply lines 91, 92 and 93 is mixed with oxygen supplied from the oxygen supply line 7 connected to an upstream portion of the arrangement of the wafers in the vicinity of the wafers 1. The oxygen supply line 7 and the hydrogen supply line 8 penetrate the ceiling wall 31 of the reaction tube 21. Gas jet openings are directed downward, and issue oxygen gas and hydrogen gas downward.

Embodiment 3

Figure 3:
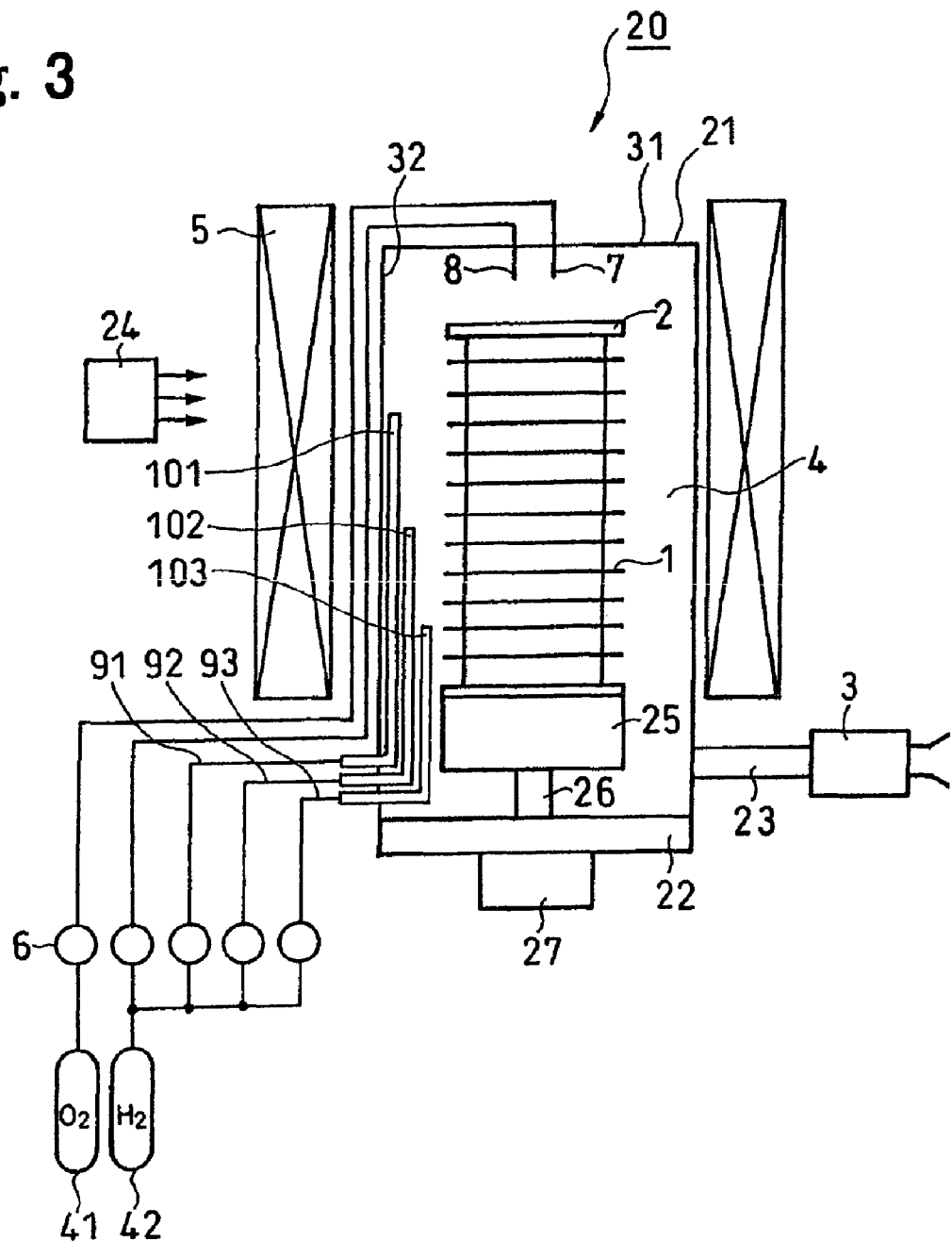
FIG. 3 is a schematic longitudinal sectional view for explaining a substrate processing apparatus according to an embodiment 3 of the present invention.

Next, a substrate processing apparatus of the embodiment 3 will be described in detail with reference to FIG. 3.

Like the embodiment 2, the hydrogen supply line 8 which is independent from the oxygen supply line 7 is connected to the ceiling wall 31 of the reaction chamber 4. The embodiment 3 is different from the embodiment 2 in that the hydrogen supply lines 91, 92 and 93 which are independent from the hydrogen supply line 8 are respectively connected to a plurality of (multi-system) nozzles 101, 102 and 103, and the nozzles 101, 102 and 103 rise along an inner wall of the sidewall 32 of the reaction tube 21 in the reaction chamber 4, and have different lengths. More specifically, the hydrogen supply lines 91, 92 and 93 are respectively connected to the hydrogen supply nozzle 101, 102, 103 which have different lengths in the direction of the arrangement of the wafers, and hydrogen concentration in the reaction chamber 4 in the direction of the arrangement of the wafers (vertical direction) can be adjusted. Tip ends of the nozzles are opened, and the openings are gas jet openings. The gas jet openings are directed upward in the reaction chamber 4, not toward the wafers 1, but the gas jet openings may be directed toward the wafers (opposed to the wafers 1) like the embodiment 2.

Embodiment 4

Figure 4:
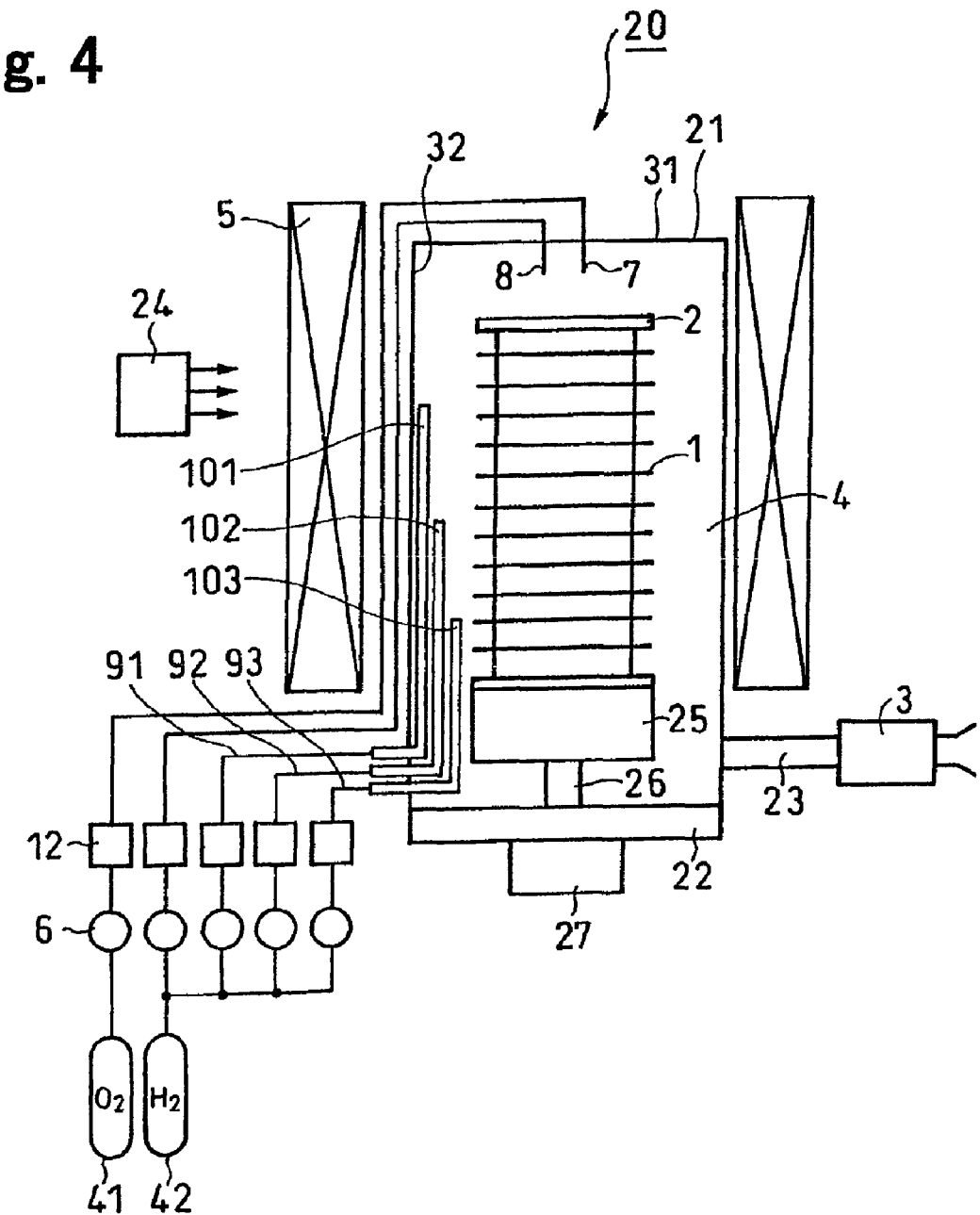
FIG. 4 is a schematic longitudinal sectional view for explaining a substrate processing apparatus according to an embodiment 4 of the present invention.

Next, a substrate processing apparatus of the embodiment 4 will be described in detail with reference to FIG. 4.

Like the embodiment 3, the hydrogen supply line 8 which is independent from the oxygen supply line 7 is connected to the reaction chamber 4, and to compensate a deficiency of hydrogen gas which is consumed by the oxidation reaction and depleted downstream, the hydrogen supply lines 91, 92 and 93 and the nozzles 101, 102 and 103 are provided, in addition to the hydrogen supply line 8. The embodiment 4 is different from the embodiment 3 in that each of the oxygen supply line 7, the hydrogen supply line 8 and the hydrogen supply lines 91, 92 and 93 has a mass flow controller 12 capable of adjusting a flow rate. With this, it is possible to adjust oxygen flow rate and hydrogen flow rate flowing through the respective supply lines, and to finely control the hydrogen concentration in the reaction chamber.

Embodiment 5

Figure 5:
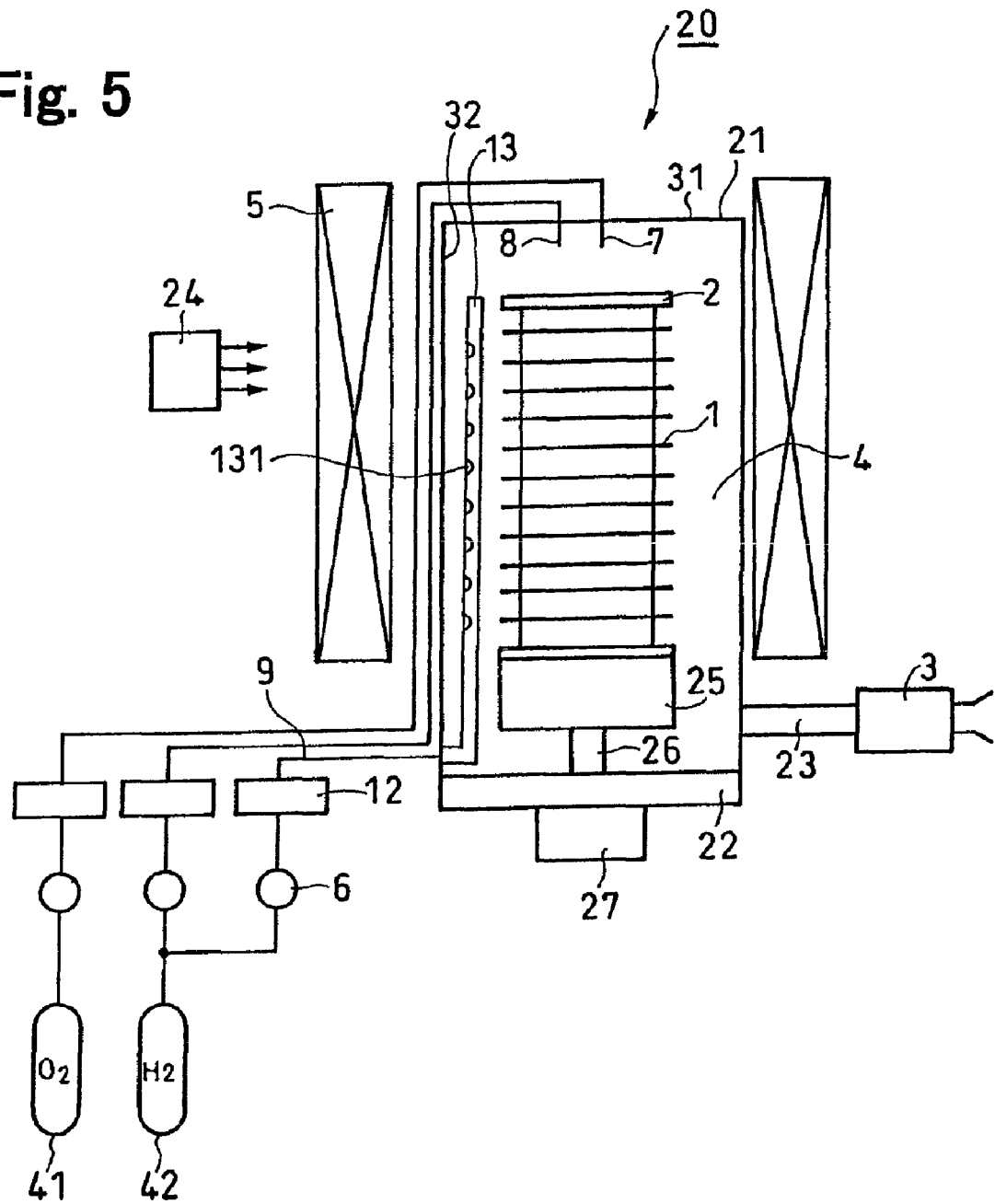
FIG. 5 is a schematic longitudinal sectional view for explaining a substrate processing apparatus according to an embodiment 5 of the present invention.

Next, a substrate processing apparatus of the embodiment 5 will be described in detail with reference to FIG. 5.

Like the embodiment 2, the hydrogen supply line 8 which is independent from the oxygen supply line 7 is connected to the reaction chamber 4. The embodiment 5 is different from the embodiment 2 in that a porous nozzle 13 is provided instead of the hydrogen supply lines 91, 92 and 93 which are independent from the hydrogen supply line 8 and which are half-way supply nozzles for adjusting hydrogen concentration in the reaction chamber. A tip end of the porous nozzle 13 is sealed, and the porous nozzle 13 is provided at its side surface with at least two small holes 131. It is possible to control the hydrogen concentration in the reaction chamber without using a plurality of hydrogen lines. The porous nozzle 13 may be provided at its side surface with at least two kinds small holes 131 having different diameters, i.e., opening areas. That is, the small holes may have at least two or more different diameters. With this, it is possible to finely control the flow rate of hydrogen flowing out from the respective small holes. In this embodiment, for a reason described later, the small holes 131 forming gas jet openings of the porous nozzle 13 are provided such as to opposed to the inner wall of the sidewall 32 of the reaction tube 21 not opposed to the wafers so that halfway supplied hydrogen is supplied toward the inner wall of the sidewall 32 of the reaction tube 21.

Embodiment 6

Figure 6:
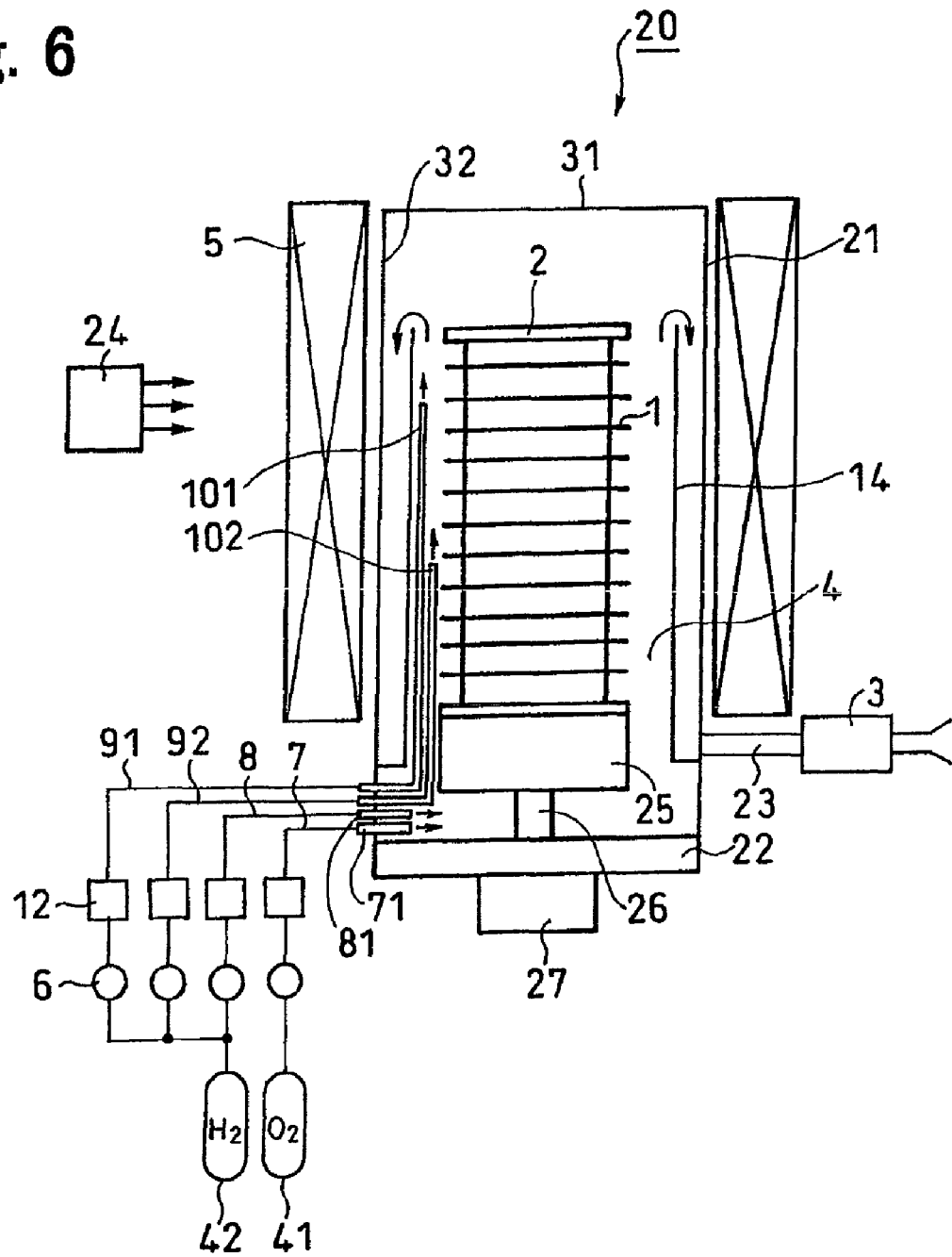
FIG. 6 is a schematic longitudinal sectional view for explaining a substrate processing apparatus according to an embodiment 6 of the present invention.

Next, a substrate processing apparatus of the embodiment 6 will be described in detail with reference to FIG. 6.

In the embodiment 6, a flowing direction of gas in the reaction chamber 4 is different from that of each of the embodiment 1 to 5. In the embodiments 1 to 5, gas basically flows in the reaction chamber 4 from above to below. In the embodiment 6, gas in the reaction chamber 4 flows from below to above. The oxygen supply line 7 and the hydrogen supply line 8 are respectively connected to an oxygen supply nozzle 71 and a hydrogen supply nozzle 81 which are provided horizontally such as to penetrate the sidewall 32 of a lower portion of the reaction tube 21. Gas jet openings of the oxygen supply nozzle 71 and the hydrogen supply nozzle 81 are directed in the horizontal direction. In the structure of the reaction chamber 4, an outer tube (reaction tube) 21 includes an inner tube 14 therein, and an interior of the reaction chamber 4 is divided by the inner tube 14. Oxygen and hydrogen which are reaction gases are supplied into the inner tube 14 from a lower portion of the reaction chamber respectively through an oxygen supply nozzle 71 and a hydrogen supply nozzle 81. A half-way supply hydrogen supply nozzle rises vertically inside of the inner tube 14. Gas after reaction and unreacted gas pass outside of the inner tube 14 (through a space between the inner tube 14 and the outer tube 21) and the gases are exhausted from the exhaust line 23 and the vacuum pump 3.

Embodiment 7

Figure 7:
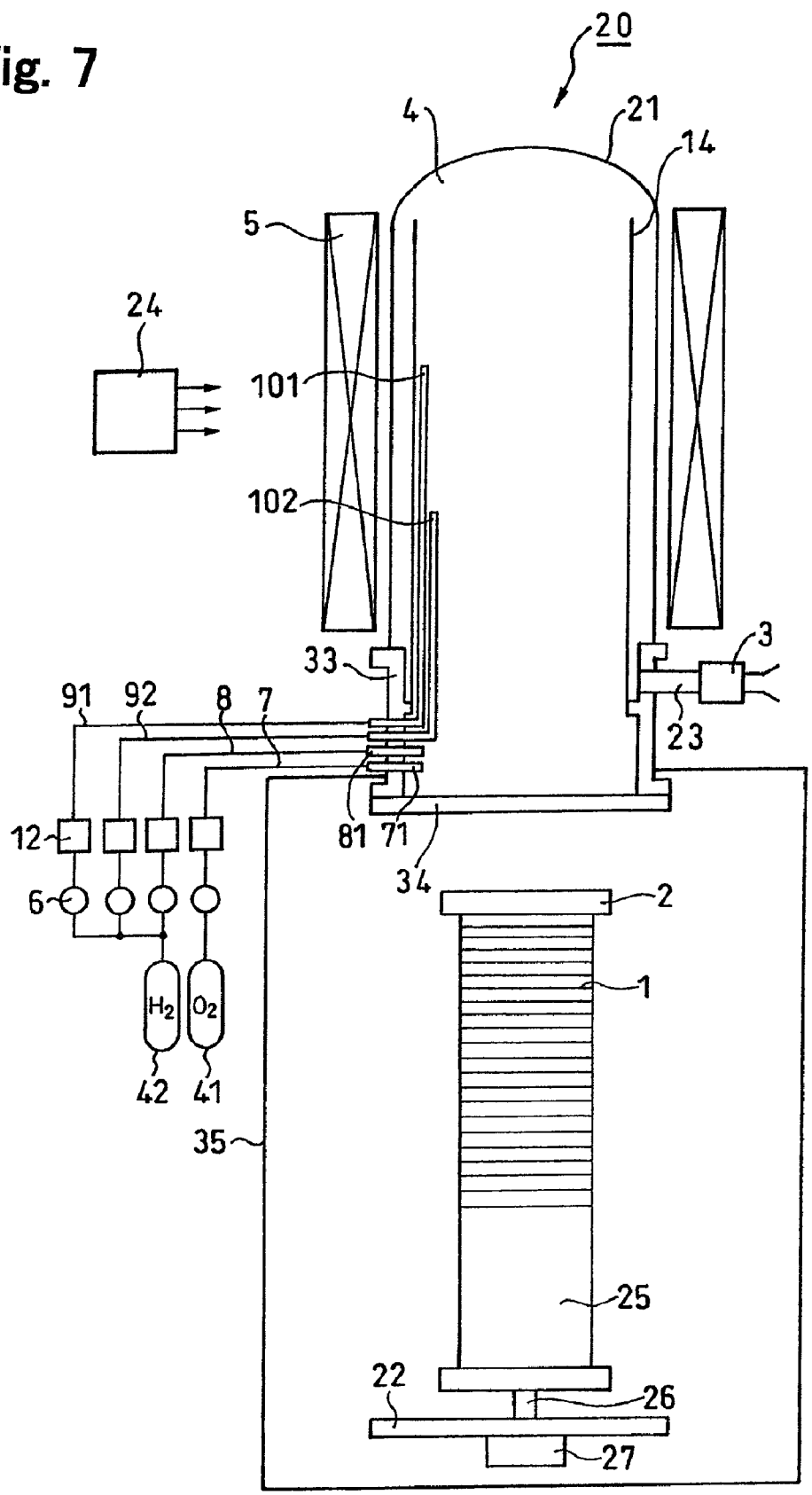
FIG. 7 is a schematic longitudinal sectional view for explaining a substrate processing apparatus according to an embodiment 7 of the present invention.
Figure 8:
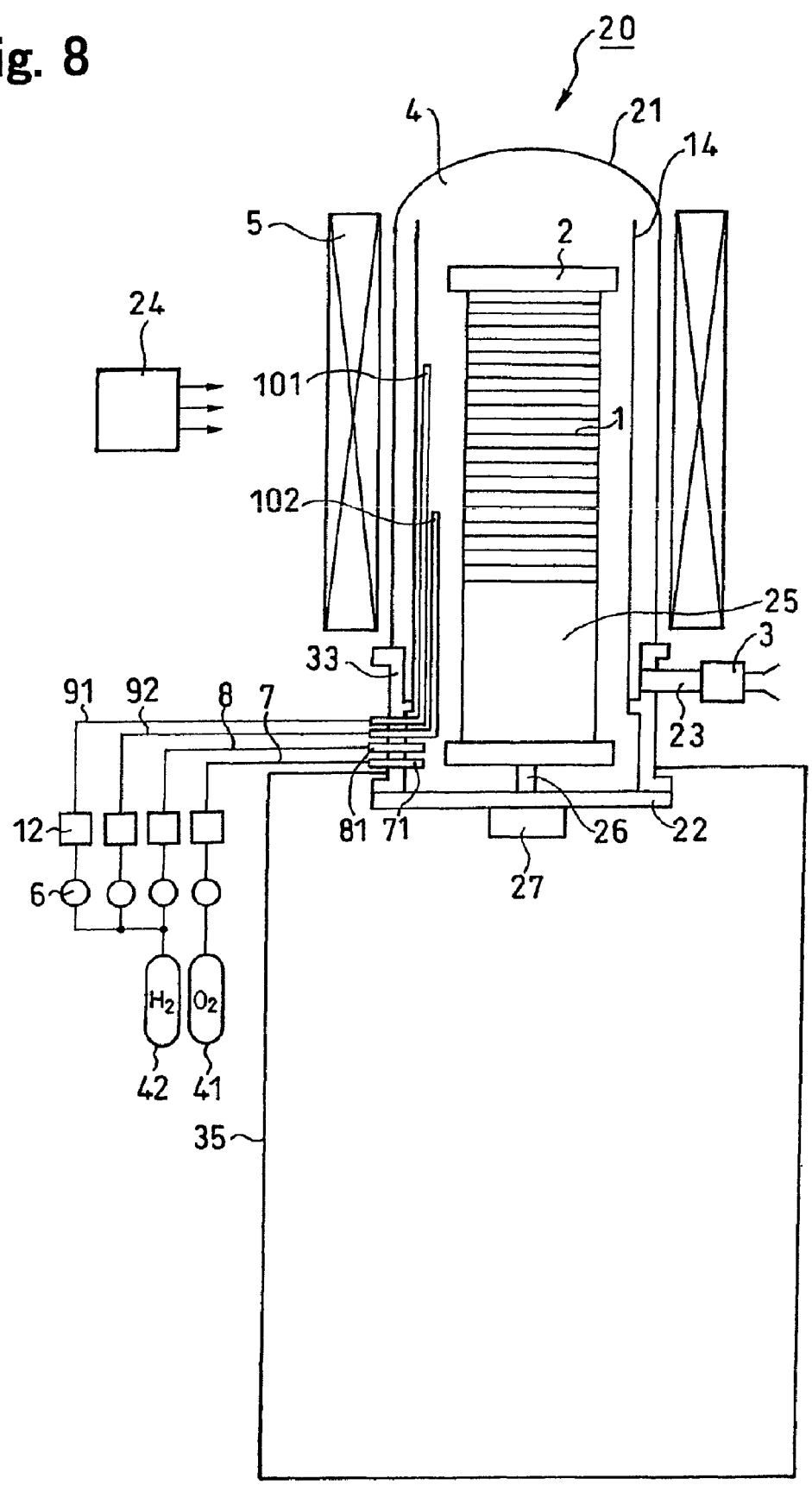
FIG. 8 is a schematic longitudinal sectional view for explaining the substrate processing apparatus according to the embodiment 7 of the present invention.

Next, a substrate processing apparatus of the embodiment 7 will be described in detail with reference to FIGS. 7 and 8.

According to the embodiment 7, many $H_2$ gas lines (multi-system) are prepared as hydrogen-containing gas supply lines, flow rates of $H_2$ in the gas lines are set different from each other and are optimized so as to enhance film thickness consistency between the wafers. This substrate processing apparatus is called a vertical furnace, and comprises the reaction furnace 20 which carries out vacuum oxidation processing for substrates, and a transfer chamber 35 for transferring wafers existing below the reaction furnace. When the oxidation processing is to be carried out, the boat 2 carrying a plurality of wafers 1 is brought into the reaction furnace 20 from the transfer chamber 35. FIG. 7 shows a state in which wafers 1 are loaded on the boat 2 in the transfer chamber 35. FIG. 8 shows a state in which boat 2 on which the wafers 1 are loaded is loaded into the reaction furnace 20. The structure of the reaction furnace 20 is the same as that of the embodiment 6, and gas flows in the reaction chamber 4 from below to above. While the boat 2 is in the transfer chamber 35, an opening of a lower end of a furnace opening flange 33 of a lower portion of the reaction chamber 4 is closed with a furnace opening gate valve 34.

The structure of the reaction chamber 4 is also the same as that of the embodiment 6. The outer tube (reaction tube) 21 includes the inner tube 14 therein, and an interior of the reaction chamber 4 is divided by the inner tube 14. When the vacuum oxidation processing is to be carried out for the substrates 1, $O_2$ as oxygen-containing gas and $H_2$ as hydrogen-containing gas which are reaction gas are supplied inside of the pressure-reduced inner tube 14 from upstream of the arrangement of wafers through the oxygen supply line 7, the oxygen supply nozzle 71, the hydrogen supply line 8 and the hydrogen supply nozzle 81 which are provided in the furnace opening flange 33 of a lower portion of the reaction chamber 4. The hydrogen-containing gas supply line 91 (nozzle 101) and the hydrogen-containing gas supply line 92 (nozzle 102) which are half-way supply lines (nozzles) for adjusting hydrogen concentration vertically rise inside of the inner tube 14. These hydrogen-containing gas supply nozzle 101 and hydrogen-containing gas supply nozzle 102 are formed and disposed in the same manner as the embodiment 3. Hydrogen gas is supplied to the substrates 1 from a plurality of half-way portions of a region where the plurality of wafers 1 exist through the hydrogen-containing gas supply nozzle 101 and the hydrogen-containing gas supply nozzle 102. In this manner, $O_2$ is introduced from one line (nozzle), but $H_2$ is introduced from many (multi-system) lines (nozzles). Each of the $H_2$ lines has an MFC (mass flow controller) 12 for adjusting the flow rate. The $O_2$ line also has an MFC (mass flow controller) 12. These MFCs provided in the lines are controlled by the control means 24. Gas after reaction and unreacted gas pass outside of the inner tube 14 (through a space between the inner tube 14 and the outer tube 21) and the gases are exhausted from the exhaust line 23 and the vacuum pump 3.

Figure 9:
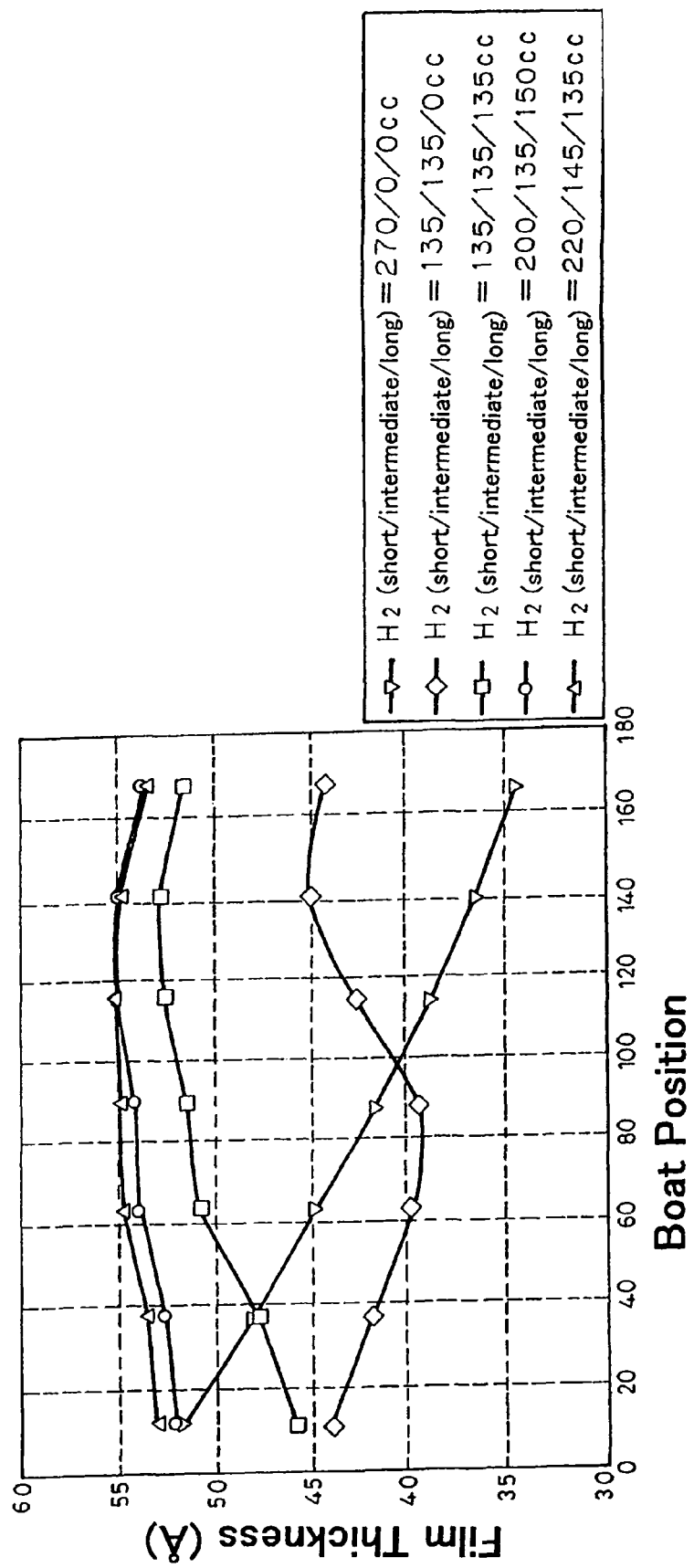
FIG. 9 is a diagram showing a result of an experiment according to the embodiment 7 of the present invention.

The present inventors carried out the vacuum oxidation processing for the substrates using this substrate processing apparatus as an experiment, and found that the film thickness consistency between the wafers was largely varied by changing the film thickness of $H_2$ of each $H_2$ line. A result of the experiment is shown in FIG. 9. FIG. 9 shows a result of wafer film thicknesses at various positions on the boat obtained while changing the flow rate of $H_2$ from each $H_2$ nozzle. The lateral axis shows positions of the boat (slot numbers as measured from the lowermost slot). The vertical axis shows film thickness. In the drawing, (short/intermediate/long) means $H_2$ nozzles 81, 102 and 101, and $H_2$ (short/intermediate/long)=220/145/135 cc means that set flow rates of the $H_2$ nozzle 81, $H_2$ nozzle 102 and $H_2$ nozzle 101 are 220 sccm, 145 sccm and 135 sccm, respectively. There exists one $O_2$ nozzle 71, and its flow rate is 2500 sccm and is constant. It can be found from FIG. 9 that the film thickness consistency is enhanced if the $H_2$ flow rates of the $H_2$ nozzles are different from each other as compared with a case in which the flow rates of the lines are constant. The optimal film thickness consistency is obtained when (short/intermediate/long)=220/145/135 cc. From this, it is preferable that flow rates of $H_2$ supplied from the lines are set greater toward upstream (smaller toward downstream). This result is one obtained when 172 wafers are processed at the same time, the temperature in the furnace is 850° C., the pressure is 35 Pa and there are three $H_2$ lines. Of course, the same tendency is shown even if the number of wafers to be processed is increased or decreased, or the number of $H_2$ lines is two, four or more. This result is obtained when a double reaction tube type furnace body having CVD structure is used, but even with a structure having no inner tube such as a diffusion furnace is used, it can be said that the same effect can be obtained. It can be found from this result, the film thickness consistency between the wafers can be enhanced by optimizing the flow rate of $H_2$ in each line.

Since the reaction generated in the furnace is supply rate-determining, gas becomes depleted toward the exhausting direction and consistency between wafers becomes poor, but since the flow rate of $H_2$ to be half-way supplied may be set such that only deficiency of gas can be compensated, the most upstream has the greatest flow rate accordingly.

Embodiment 8

Next, the embodiment 8 will be explained in detail with reference to FIG. 10.

The embodiment 8 relates to a result of an experiment carried out using the substrate processing apparatus of the embodiment 7.

Figure 10:
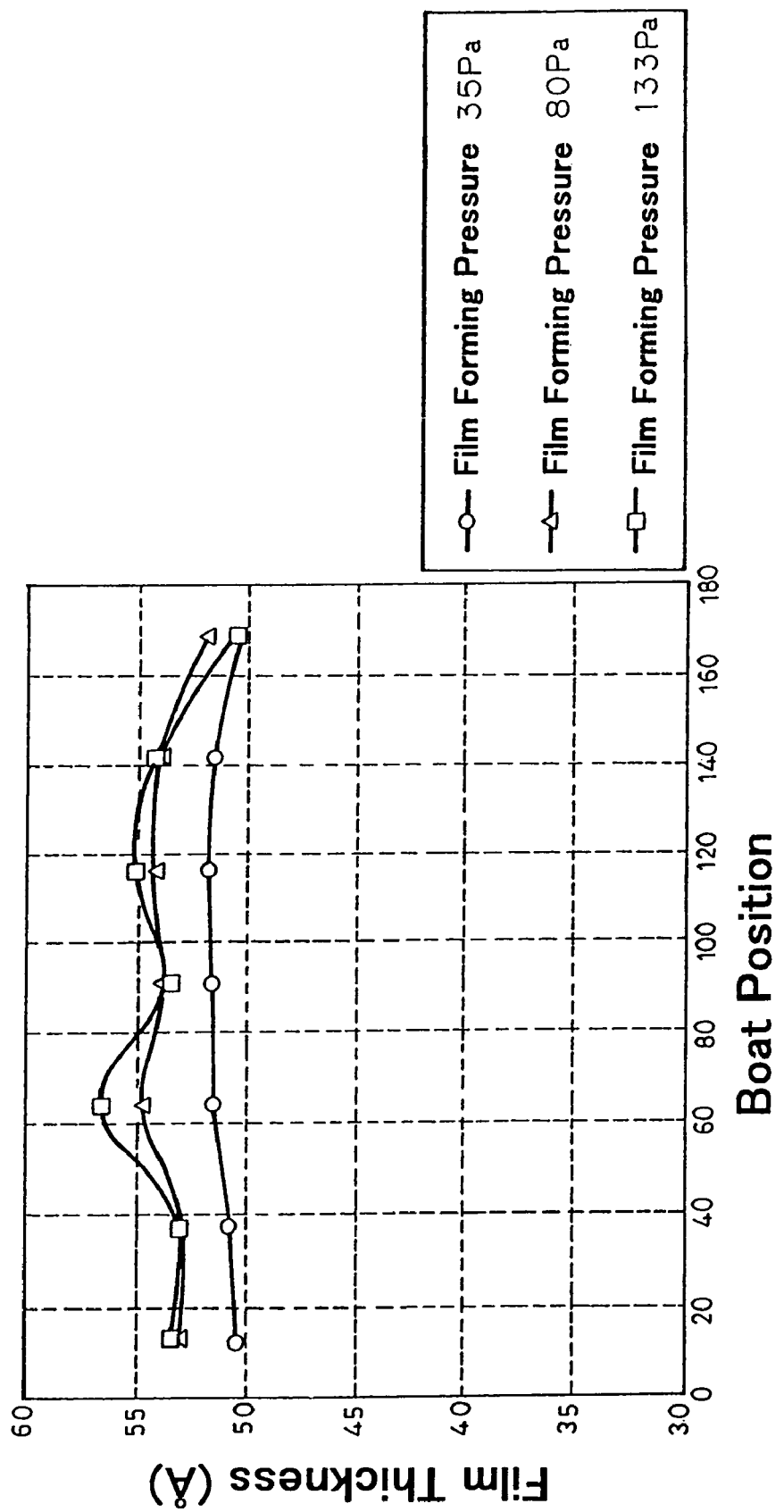
FIG. 10 is a diagram showing a result of an experiment according to an embodiment 8 of the present invention.

FIG. 10 shows distribution of wafer film thicknesses on various positions on the boat generated by changing the processing (film forming) pressure. There exists one $O_2$ nozzle 71, and its flow rate is 2500 sccm and is constant. There are three $H_2$ nozzles 81, 102 and 101, and their flow rates are set to short/intermediate/long=240/145/135 cc. It can be found from FIG. 10 that the processing pressure is preferably equal to or lower than 35 Pa. It can also be found that the higher the pressure is, the poorer the film thickness distribution between wafers becomes. From this, it can be said that it is preferable to optimize the flow rates of the $H_2$ nozzles and the number of the nozzles by the processing pressure.

Embodiment 9

Next, the embodiment 9 will be explained in detail with reference to FIG. 11.

The embodiment 9 relates to a result of an experiment carried out using the substrate processing apparatus of the embodiment 7.

Figure 11:
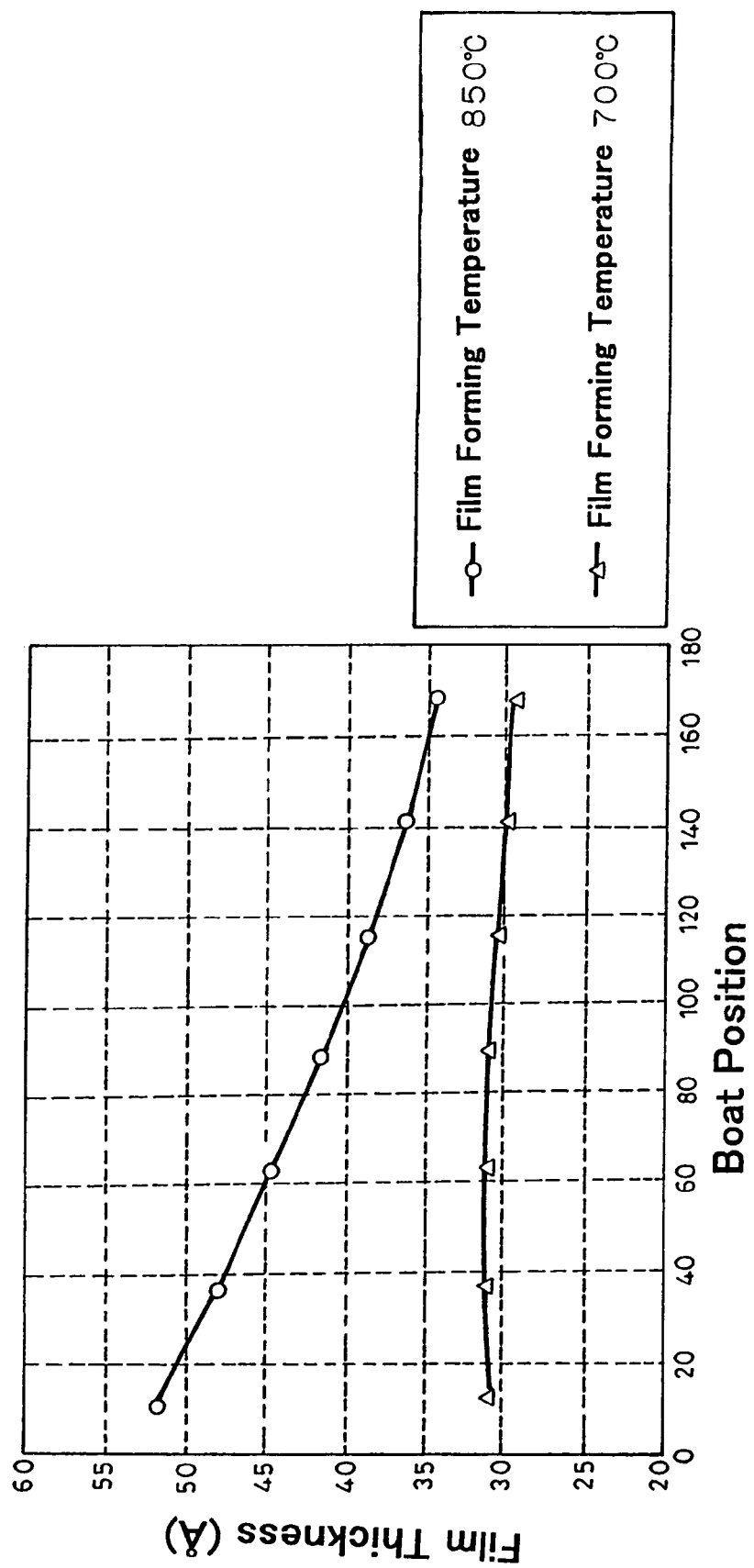
FIG. 11 is a diagram showing a result of an experiment according to an embodiment 9 of the present invention.
Figure 12:
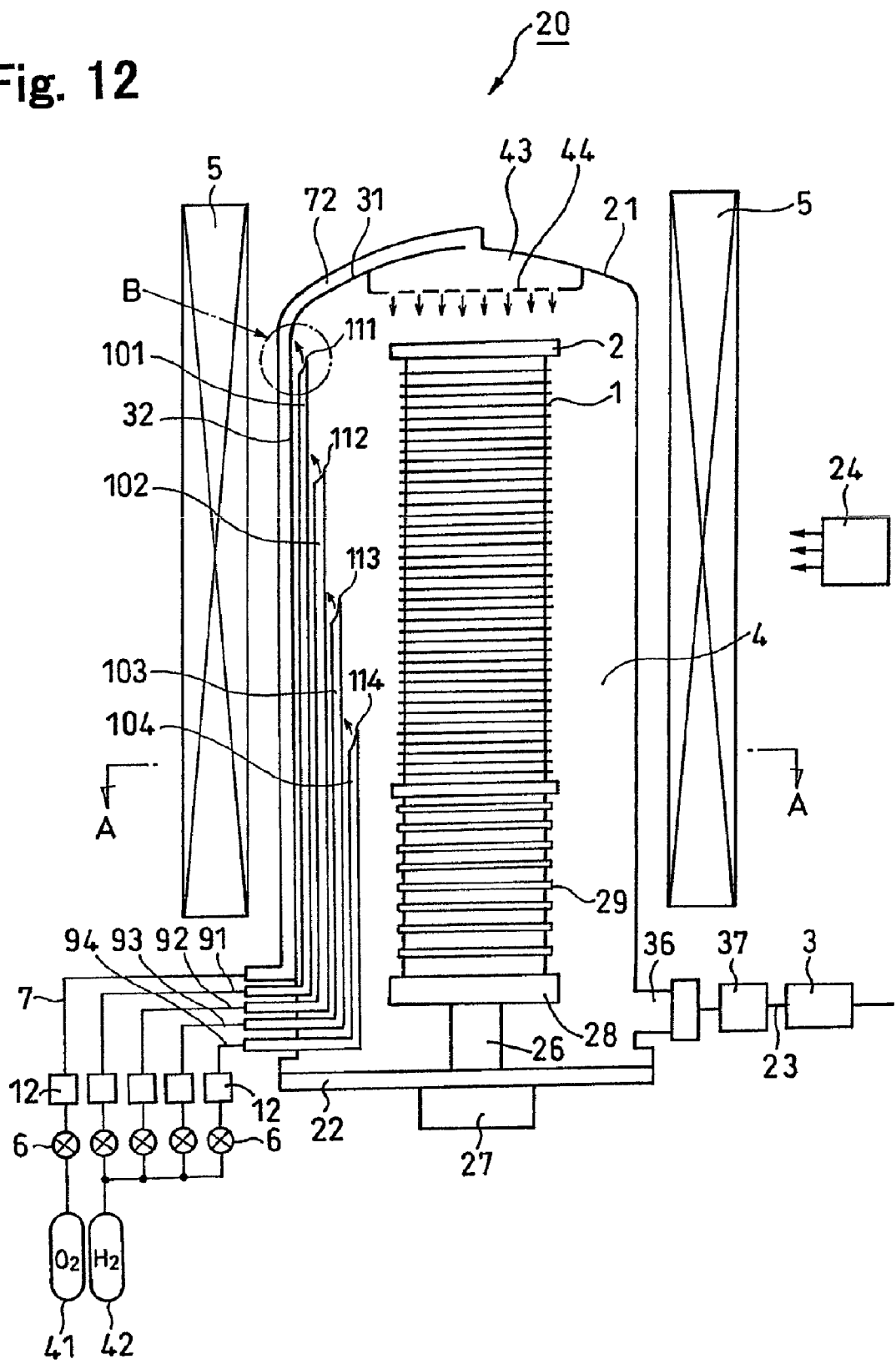
FIG. 12 is a schematic longitudinal sectional view for explaining a substrate processing apparatus according to an embodiment 10 of the present invention.
Figure 13:
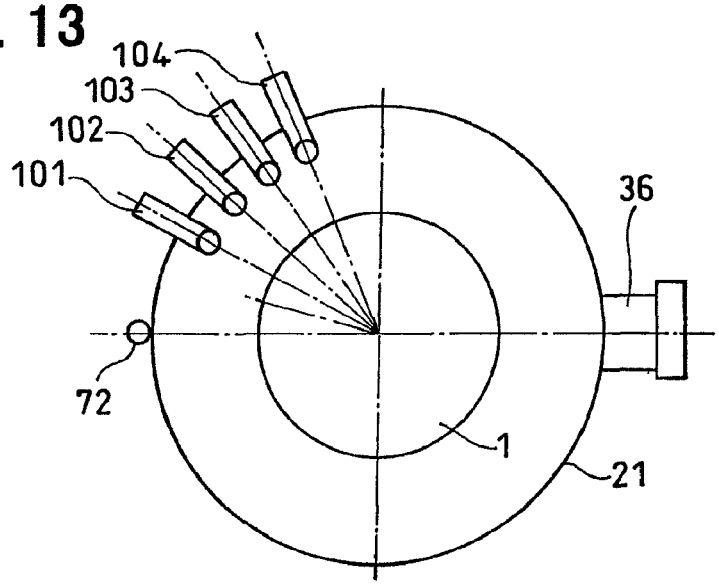
FIG. 13 is a schematic transversal sectional view taken along a line A-A in FIG. 12.

FIG. 11 shows distribution of wafer film thicknesses on various positions on the boat generated by changing the processing (film forming) temperature. There exists one $O_2$ nozzle 71, and its flow rate is 2500 sccm and is constant. There also exists one $H_2$ nozzle 81, and its flow rate is 240 sccm. It can be found from FIG. 10 that the processing temperature is preferably equal to or lower than 700° C. As the processing temperature is lower, the film thickness distribution is improved, and as the processing temperature is higher, the film thickness distribution becomes poorer. From this, it can be said preferable to optimize the flow rates of the $H_2$ nozzles and the number of the nozzles by the processing temperature like the embodiment 8.

In the embodiment 9, the wafer film thickness consistency on the various positions on the boat is enhanced at 700° C. or lower. This is because that $H_2$ is supplied only through the $H_2$ nozzle 81, and the flow rate in the furnace by the $H_2$ nozzles 101 and 102 is not adjusted. In this process, i.e., the process in which $O_2$ and $H_2$ are introduced into the reaction chamber having vacuum atmosphere, since $H_2$ is consumed upstream, $H_2$ becomes depleted downstream, but as the processing temperature is lower, the amount of consumed $H_2$ is reduced and thus, deficiency of gas is not easily generated downstream. As a result, the wafer film thickness consistency at various positions is enhanced at 700° C. or lower, and it becomes easy to adjust the flow rate of the nozzle. In this embodiment, $SiO_2$ dummy wafer is introduced. If the $SiO_2$ dummy wafer is introduced, the consumption amount of $H_2$ is largely varied, and even if the temperature is low, it becomes necessary to adjust the flow rate in the furnace by the $H_2$ nozzles 101 and 102.

Embodiment 10

In the embodiments 1 to 7, $H_2$ is half-way supplied and is also supplied from upstream. In the embodiment 10, $H_2$ is not supplied from upstream and only half-way supply is carried out.

With reference to FIGS. 12 to 15, in the batch type vertical semiconductor producing apparatus (oxidation apparatus) as the substrate processing apparatus of the present embodiment, the reaction furnace 20 includes the reaction tube 21, and the boat 2 as the substrate holding tool is inserted into the reaction chamber (processing chamber) 4 formed by the reaction tube 21. The boat 2 holds a plurality of semiconductor wafers 1 in their substantially horizontal state at predetermined distances from one another. A lower portion of the reaction tube 21 is opened so that the boat 2 is inserted thereinto, and this opening is tightly closed with a seal cap 22. The boat 2 is mounted on a boat receiver 28, and the boat receiver 28 is mounted on the rotation mechanism 27 through the rotation shaft 26. A plurality of heat insulating boards 29 are mounted on a lower portion of the boat 2, and a resistance heater 5 as a heat source is disposed around the reaction tube 21.

Connected to the reaction tube 21 are the oxygen supply line 7 which supplies oxygen ($O_2$) gas as oxygen-containing gas, and hydrogen supply lines 91, 92, 93 and 94 which supply hydrogen ($H_2$) gas as hydrogen-containing gas. The oxygen supply line 7 is connected to an oxygen gas supply source 41, and the hydrogen supply lines 91, 92, 93 and 94 are connected to a hydrogen gas supply source 42. The oxygen supply line 7 and the hydrogen supply lines 91, 92, 93 and 94 are respectively provided with solenoid valves 6 and mass flow controllers 12.

A shower plate 44 is mounted on a ceiling wall 31 of the reaction tube 21. The ceiling wall 31 and the shower plate 44 form a buffer chamber 43. The oxygen supply line 7 is connected to an oxygen supply tube 72. The oxygen supply tube 72 extends to an outer side of the sidewall 32 from a lower portion of the reaction tube 21 and then, extends to an upper side of the ceiling wall 31 of the reaction tube 21 and comes into communication with the buffer chamber 43. In this embodiment, only $O_2$ is introduced from the most upstream shower plate 44.

The hydrogen supply lines 91, 92, 93 and 94 are independent from each other, and are respectively connected to hydrogen supply nozzles 101, 102, 103 and 104. The hydrogen supply nozzles 101, 102, 103 and 104 penetrate the sidewall 32 of the reaction tube 21. The hydrogen supply nozzles 101, 102, 103 and 104 rise in the reaction tube 21 along the inner wall of the sidewall 32 of the reaction tube 21, and the rising lengths are different from each other. In this manner, the hydrogen supply nozzles 101, 102, 103 and 104 have different lengths in the arrangement direction of the wafers, and $H_2$ is supplied from the plurality of locations (four locations in this embodiment) in the wafer arrangement region, and the hydrogen concentration in the reaction chamber 4 in the wafer arrangement direction (vertical direction) can be adjusted. Here, $H_2$ is not supplied from the shower plate 44.

The hydrogen supply nozzles 101, 102, 103 and 104 are provided along an inner wall closer to the inner wall of the sidewall 32 of the reaction tube 21 than the wafers 1. Tip ends of the hydrogen supply nozzles 101, 102, 103 and 104 are opened, and these openings are gas jet openings 111, 112, 113 and 114.

The gas jet opening 111 of the nozzle 101 which is the longest among the hydrogen supply nozzles 101, 102, 103 and 104 is separated away from the shower plate 44, and is located at a position corresponding to an upper end (wafer of most upstream wafer) in the wafer arrangement region.

Figure 14:
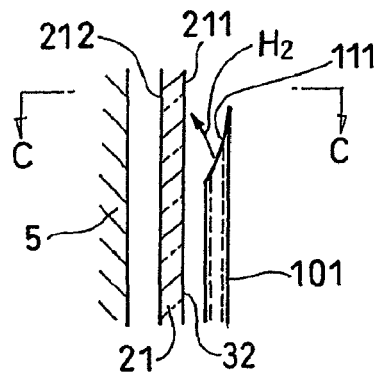
FIG. 14 is a partially enlarged schematic longitudinal sectional view of B portion in FIG. 12.
Figure 15:
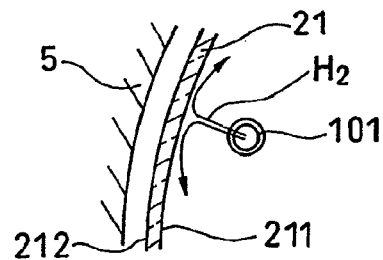
FIG. 15 is a schematic transversal sectional view taken along a line C-C in FIG. 14.
Figure 16:
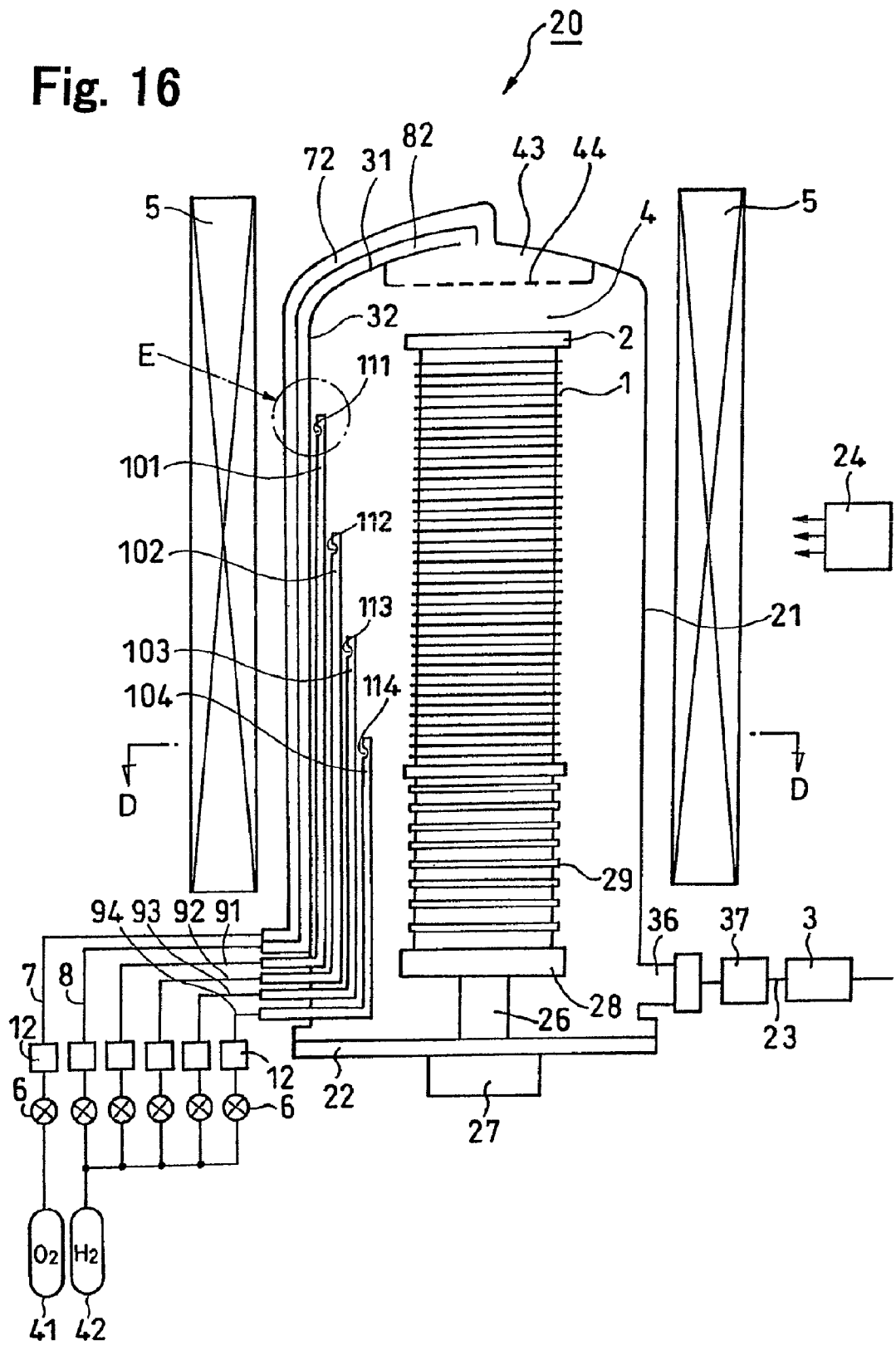
FIG. 16 is a schematic longitudinal sectional view for explaining a substrate processing apparatus according to an embodiment 11 of the present invention.
Figure 17:
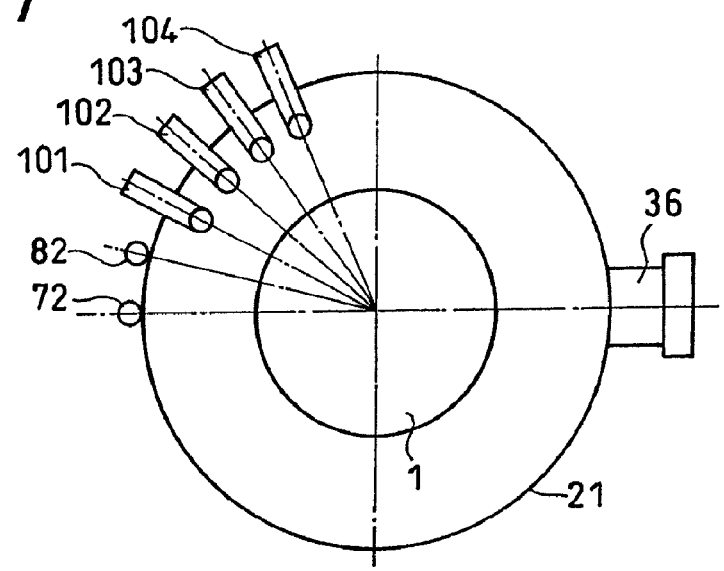
FIG. 17 is a schematic transversal sectional view taken along a line D-D in FIG. 12.
Figure 18:
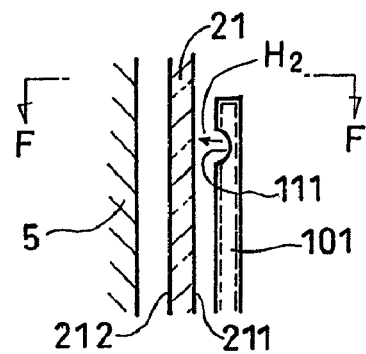
FIG. 18 is a partially enlarged schematic longitudinal sectional view of E portion in FIG. 12.
Figure 19:
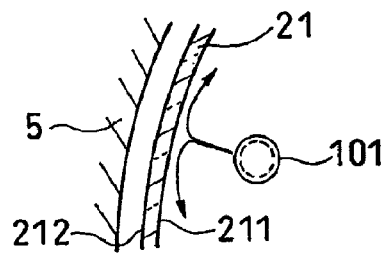
FIG. 19 is a schematic transversal sectional view taken along a line F-F in FIG. 18.
Figure 20:
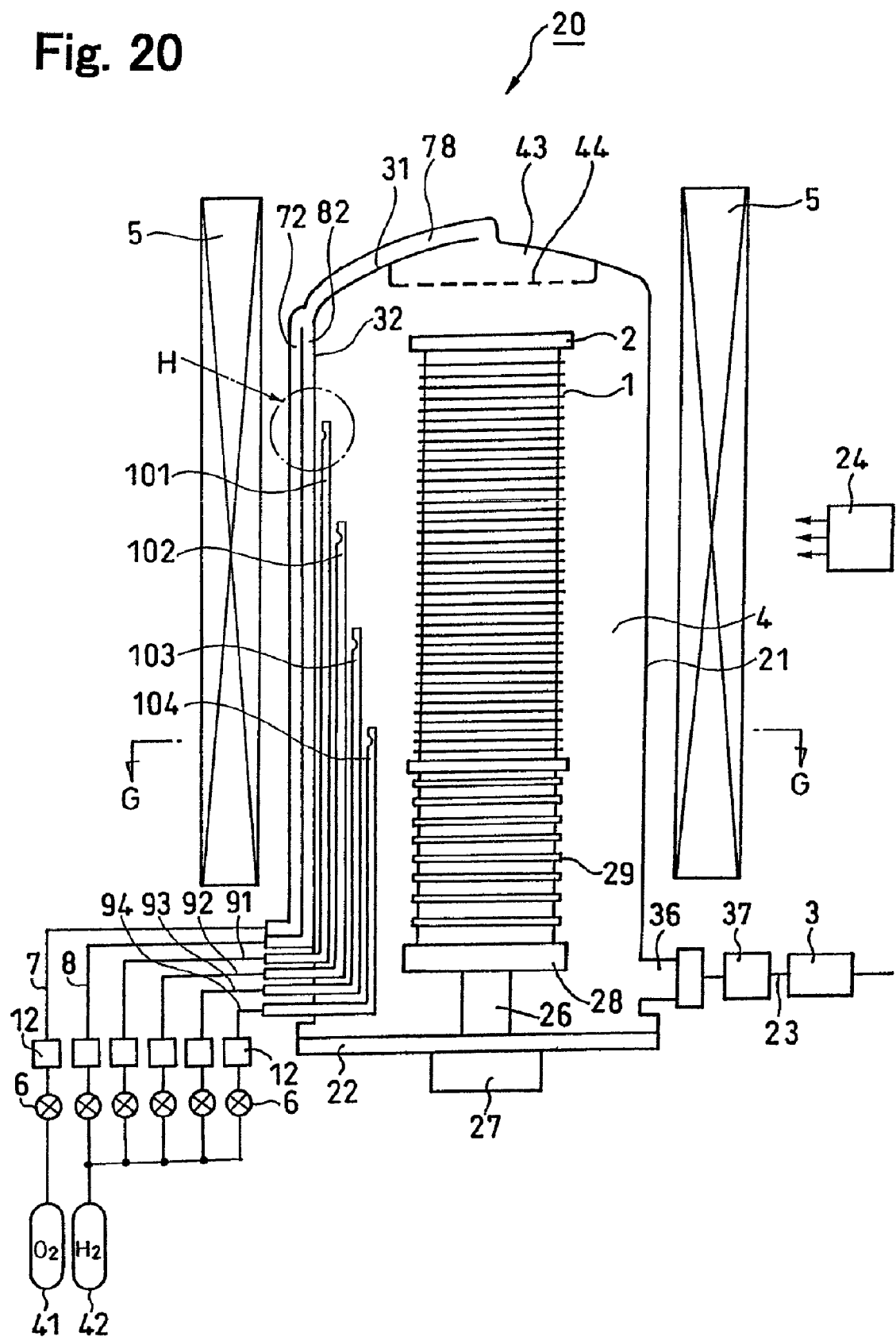
FIG. 20 is a schematic longitudinal sectional view for explaining a substrate processing apparatus according to an embodiment 12 of the present invention.
Figure 21:
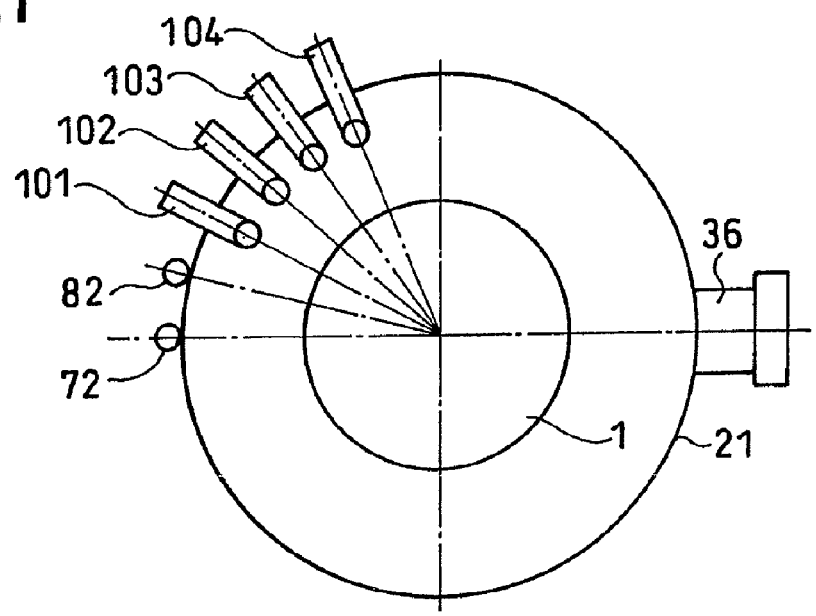
FIG. 21 is a schematic transversal sectional view taken along a line G-G in FIG. 20.
Figure 22:
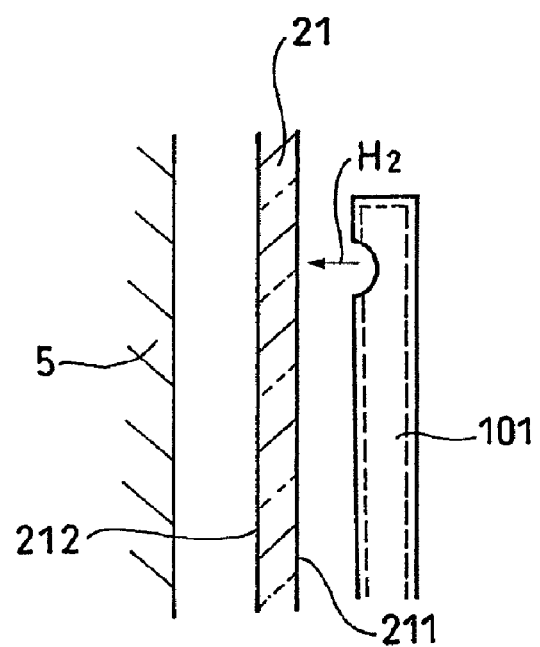
FIG. 22 is a partially enlarged schematic longitudinal sectional view of H portion in FIG. 20.

Referring to FIGS. 14 and 15, a tip end of the hydrogen supply nozzle 101 is diagonally cut, and the gas jet opening 111 is directed toward an inner wall 211 of the sidewall 32 of the reaction tube 21 in the vicinity of the inner wall 211. With this, $H_2$ which is to be half-way supplied can be issued toward the inner wall 211 of the sidewall 32 of the reaction tube 21, and it is possible to allow $H_2$ and $O_2$ to efficiently react with each other in the vicinity of the sidewall 32 by the heat of the sidewall 32 which is heated by the heater 5. If $H_2$ and $O_2$ react with each other in the vicinity of the sidewall 32 by the heat of the sidewall 32 of the reaction tube 21, reaction species are produced near the sidewall 32, the produced reaction species can stably be supplied to the wafers 1, and the film thickness consistency can be enhanced.

In this embodiment, $H_2$ and $O_2$ react with each other near the sidewall 32, and the embodiment is different from a method in which $H_2$ and $O_2$ react with each other near the wafers by the heat of the wafers 1. If $H_2$ and $O_2$ react with each other near the wafers, unstable reaction species generated at the initial stage of reaction affect the processing of the wafers 1, and there is a possibility that this affects the film thickness consistency.

The hydrogen supply nozzle 101 has been explained above, but the same can be applied to the hydrogen supply nozzles 102, 103 and 104.

The reaction tube 21 is provided at its lower portion with an exhaust tube 36, and an exhaust line 23 from which process gas is exhausted is connected to the exhaust tube 36. The pressure control means 37 and the vacuum pump 3 are connected to the exhaust line 23. During the processing of wafers, the pressure in the reaction tube 21 is set to a predetermined pressure (reduced pressure) lower than the atmospheric pressure, and this pressure control is carried out by pressure control means 37 and the control means 24.

Embodiment 11

In the embodiments 1 to 7, $H_2$ and $O_2$ are supplied into the reaction chamber 4 through the independent nozzles in the most upstream, but in the embodiment 11, $H_2$ and $O_2$ are mixed in the most upstream buffer chamber 43, and the mixture gas of $H_2$ and $O_2$ is introduced into the reaction chamber 4 from the most upstream shower plate 44. Even if the $O_2$ and $H_2$ are previously mixed with each other and then the mixture is introduced into the reaction chamber 4, reaction species having higher reactivity than those of $O_2$ and $H_2$ is produced.

Referring to FIGS. 16 to 19, this embodiment is different from the embodiment 11; in a structure in which the hydrogen supply lines 91, 92, 93 and 94 are further provided with independent hydrogen supply lines 8, the hydrogen supply lines 8 are connected to a hydrogen supply tube 82, the hydrogen supply tube 82 extends outside of the sidewall 32 from a lower portion of the reaction tube 21 and then, extends above the ceiling wall 31 of the reaction tube 21 and comes into contact with the buffer chamber 43, $H_2$ and $O_2$ are mixed with each other in the buffer chamber 43 and then, the mixture is supplied into the reaction chamber 4; in a structure in which the gas jet opening 111 of the nozzle 101 that is the longest among the hydrogen supply nozzles 101, 102, 103 and 104 is located at a position that is separated away from the shower plate 44 and lower than a position corresponding to the upper end (most upstream wafer) of the wafer arrangement region, and $H_2$ flows from the half-way portion in the wafer arrangement region not from one end of the wafer arrangement region; and in a structure in which upper surfaces of the hydrogen supply nozzles 101, 102, 103 and 104 are closed, the side surfaces of tip ends of the nozzles are provided with the gas jet openings 111, 112, 113 and 114, and the gas jet openings 111, 112, 113 and 114 are directed toward the inner wall 211 of the sidewall 32 of the reaction tube 21 in the vicinity of the inner wall 211. Other structure is the same as that of the embodiment 11.

Embodiment 12

In the embodiment 12 also, the mixture gas of $H_2$ and $O_2$ is introduced into the reaction chamber 4 from the most upstream shower plate 44. In the embodiment 1, $H_2$ and $O_2$ are mixed with each other in the buffer chamber 43. The embodiment 12 is different from the embodiment 11 in that the oxygen supply tube 72 and the hydrogen supply tube 82 are connected to each other upstream from the buffer chamber 43, and $O_2$ and $H_2$ are mixed with each other not in the buffer chamber 43 but in a pipe located upstream from the connection between the oxygen supply tube 72 and the hydrogen supply tube 82. Other structure is the same as that of the embodiment 11.

Embodiment 13

To physically confirm the isotropic oxidation of the present invention, wafers of STI (Shallow Trench Isolation) structure to which the present invention was preferably applied were prepared, and TEM of cross section structure thereof was observed.

Figure 23:
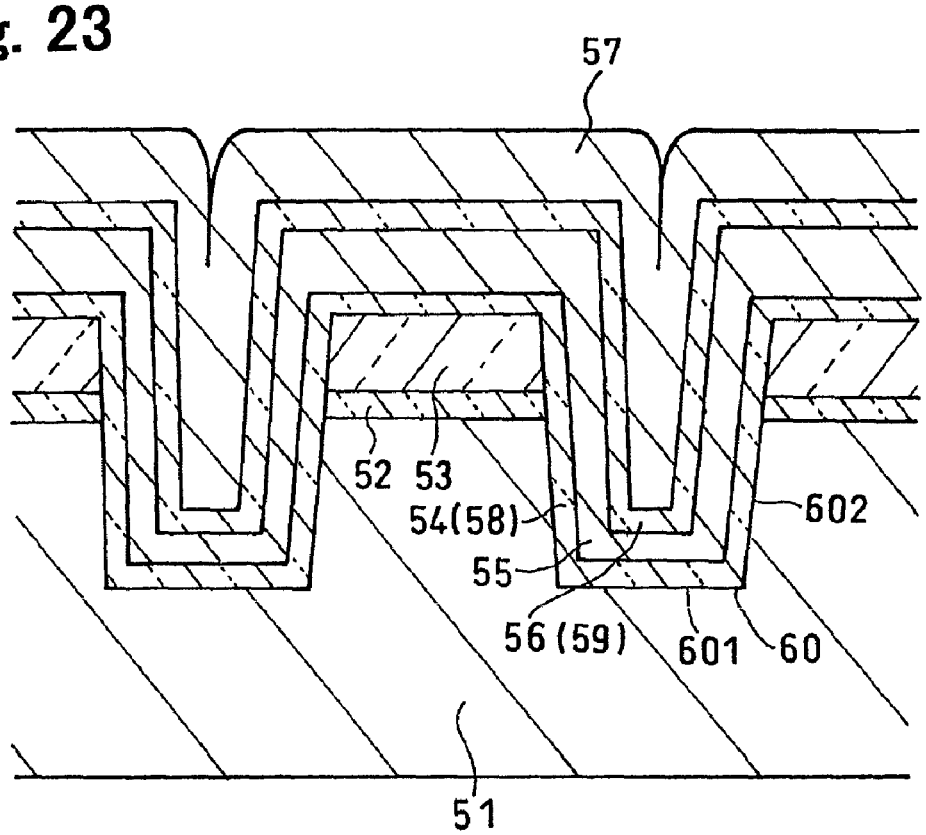
FIG. 23 is a schematic longitudinal sectional view for explaining a wafer structure prepared according to an embodiment 13 of the present invention.

Referring to FIG. 23, in this embodiment, the wafer was prepared in such a manner that a pad silicon oxide film 52 was formed on a surface of a silicon substrate 51, an $Si_3N_4$ film 53 was formed thereon and then, a groove 60 was formed and then, an oxide film 54 was formed, a non-doped polysilicon film 55 was formed thereon, an oxide film 56 was formed thereon, and a non-doped polysilicon film 57 was further formed thereon.

Then, $H_2$ was allowed to flow at 494 sccm, $O_2$ was allowed to flow at 2000 sccm, concentration of $H_2$ was set to 19.8%, the temperature was set to 950° C., the pressure was set to 40.3 Pa, and oxidation was carried out for 42 minutes, and the oxide film 54 and the oxide film 56 were formed.

Figure 24:
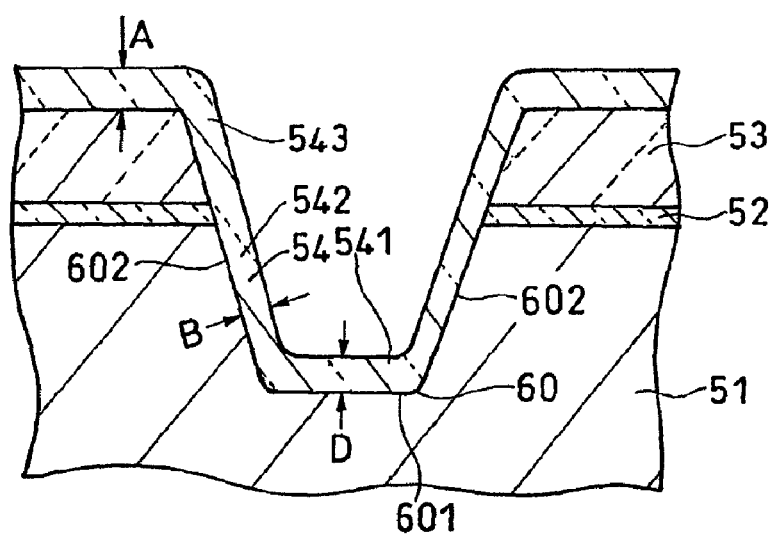
FIG. 24 is a schematic longitudinal sectional view for explaining a wafer prepared according to the embodiment 13 of the present invention.
Figure 25:
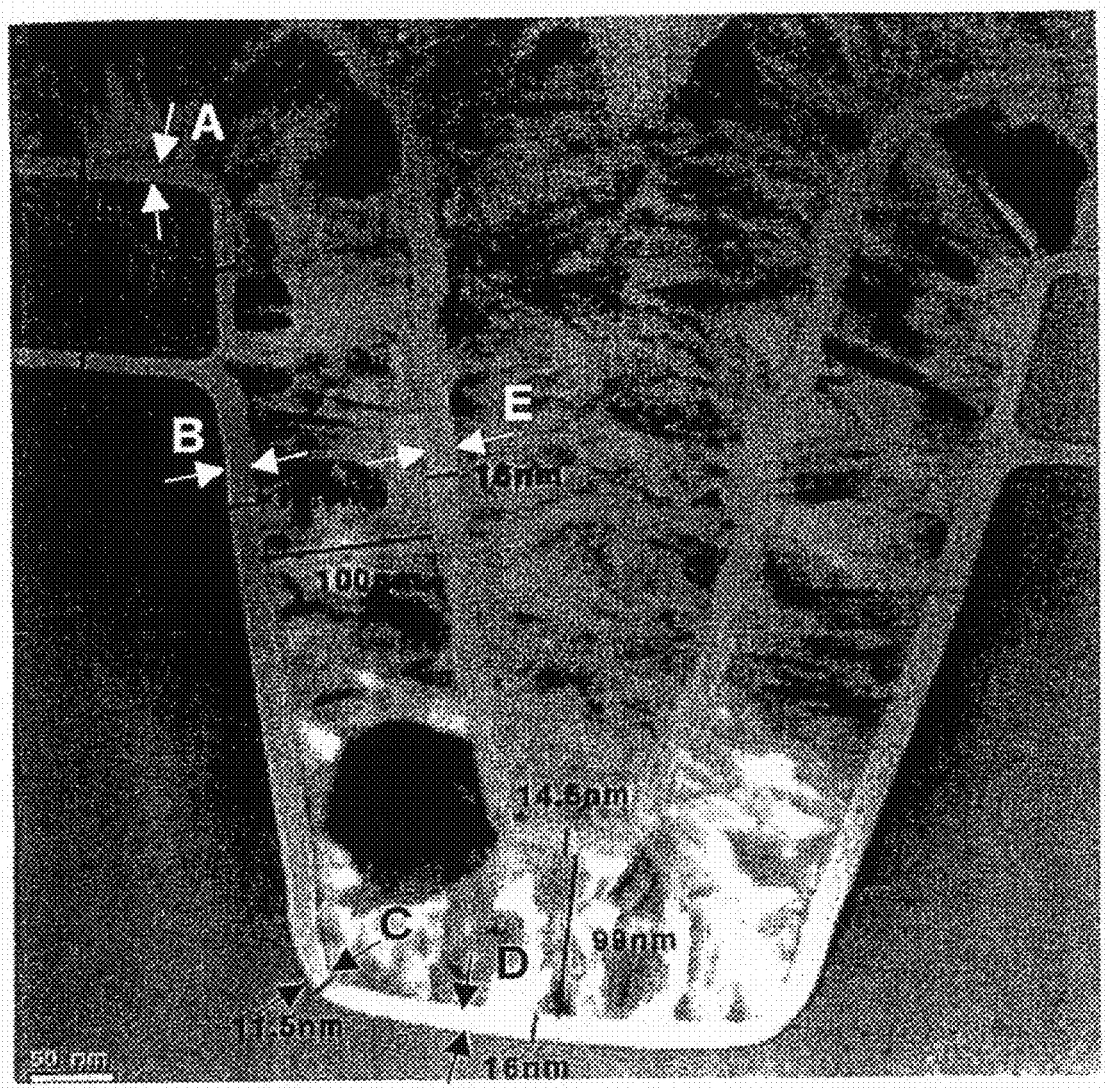
FIG. 25 is a transmission electron microscope image of a wafer prepared according to the embodiment 13 of the present invention.

FIG. 24 is a schematic vertical sectional view of a wafer prepared according to this embodiment. FIG. 25 is a TEM image of the water prepared according to this embodiment.

For comparison, $H_2$, $O_2$ and $N_2$ were allowed to flow at 3000 sccm, 3000 sccm and 20000 sccm, respectively, concentration was set to 11.5%, the temperature was set to 950° C., wet oxidation was carried out for 8.5 minutes under atmospheric pressure, and an oxide film 58 and an oxide film 59 were formed.

Figure 26:
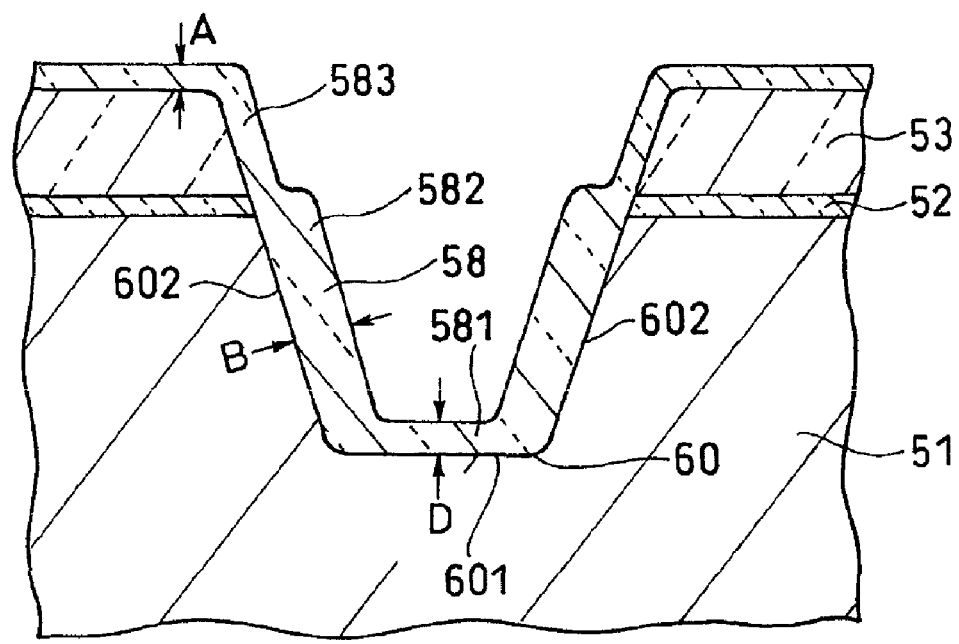
FIG. 26 is a schematic longitudinal sectional view for explaining a wafer prepared according to an comparative example.
Figure 27:
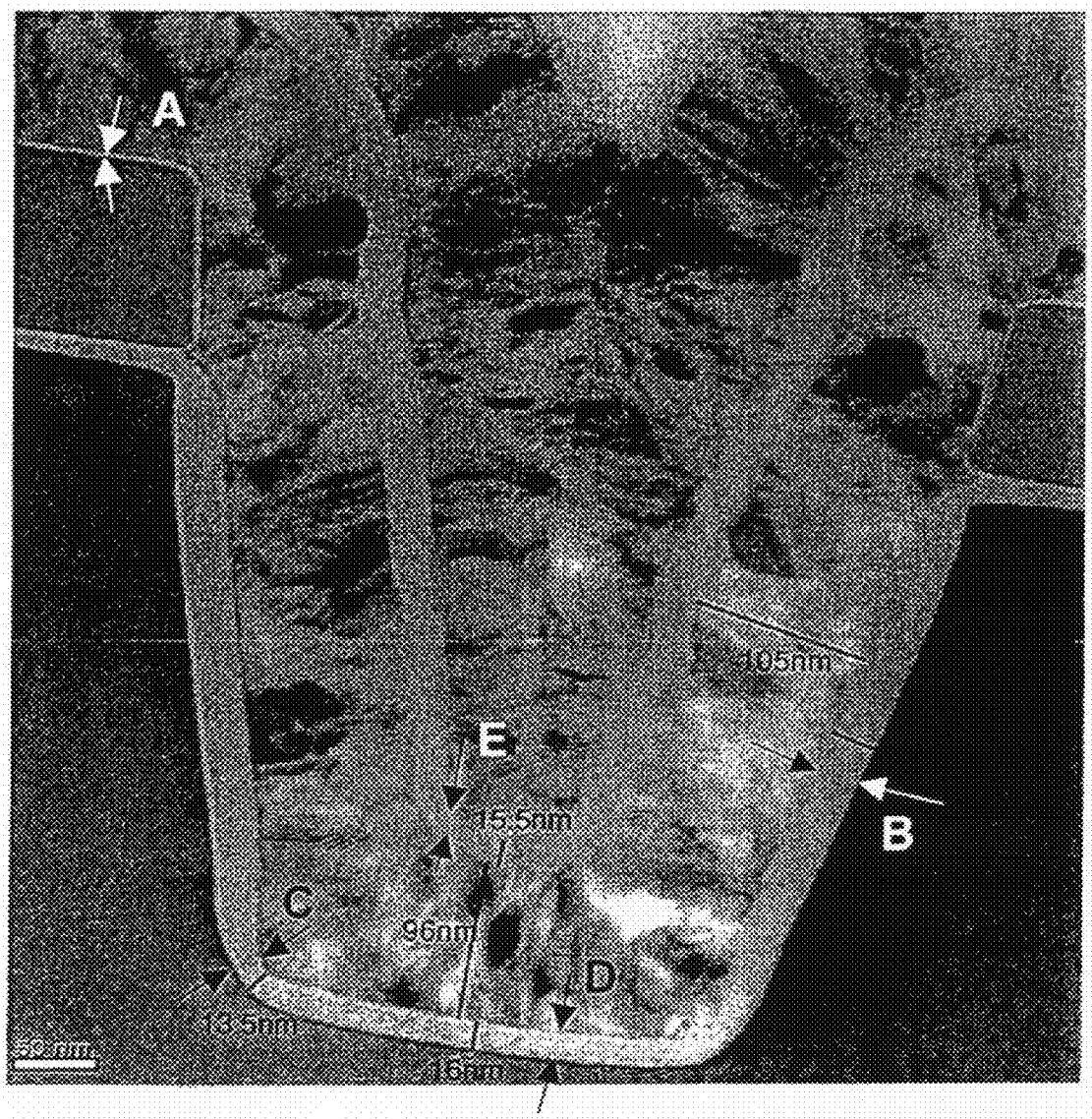
FIG. 27 is a transmission electron microscope image of a wafer prepared according to comparative example.

FIG. 26 is a schematic vertical sectional view of the wafer prepared as a comparative example. FIG. 27 a TEM image of the wafer prepared as the comparative example.

Since a bottom surface 601 and a side surface 602 of the groove 60 have different surface orientations of exposed silicon, it is considered that oxidation speeds are different in normal oxidation, and since the $Si_3N_4$ film 53 is resistant to oxidizing, it is considered that oxide films formed on the bottom surface 601 of the groove 60, the side surface 602 of the groove 60 and the $Si_3N_4$ film 53 have different film thicknesses in normal oxidation. It is considered that such difference in film thickness on an oxide film formed on the non-doped polysilicon film 55 can not be found even in normal oxidation.

Referring to FIGS. 26 and 27, in wet oxidation which is the conventional method, film thickness B (=26 nm) of an oxide film 582 on a side surface 602 of the groove 60 is thicker than film thickness D (=16 nm) of an oxide film 581 on a bottom surface 601 of the groove 60, and difference in oxidation speed which depends upon crystal plane orientation of the silicon substrate 51 is clearly seen. That is, anisotropy is clearly be seen. Further, film thickness A (=1.7 nm) of an oxide film 583 on the $Si_3N_4$ film 53 is smaller than film thicknesses B (=26 nm) and D (=16 nm), development of oxidation is slow, and oxidation resistance of the $Si_3N_4$ film 53 is seen.

On the other hand, referring to FIGS. 24 and 25, in the wafer of this embodiment processed in accordance with the present invention, the film thickness D (=16 nm) of the oxide film 541 on the bottom surface 601 of the groove 60 and the film thickness B (=16.5 nm) of the oxide film 542 are substantially equal to each other, and it can be found that the oxidation speed does not depend on crystal plane orientation of the silicon substrate 51. That is, isotropic oxidation is clearly seen. The film thickness A of the oxide film 543 on the $Si_3N_4$ film 53 is 13 nm, and substantially the same film thickness oxidation as the film thicknesses B (16.5 nm) and D (=16 nm) of the oxide film 54 of the silicon substrate 51 can be confirmed, proceeding of oxidation can be seen also on the $Si_3N_4$ film 53 which shows high oxidation resistance against wet oxidation.

The wet oxidation depends on diffusion in $H_2O$ gas film, whereas, in the present invention, since oxidation proceeds by high energy of the reaction species produced by the reaction between $O_2$ and $H_2$, this difference can be seen.

Further, film thickness E of the oxide film 56 formed on the non-doped polysilicon film 55 is 15.5 nm in the case of the wet oxidation, and film thickness of the wafer of this embodiment processed in accordance with the present invention is 16 nm, and large difference can not be seen in thickness of the grown film. Further, variation caused depending upon location is also small in both wet oxidation and the method of the present invention.

Preferred embodiments of the present invention have been explained above, the preferable processing temperature of the invention is in a range of 500° C. to 950° C., and the preferable processing pressure is in a range of some Pa to 1000 Pa. Since if the processing temperature is not about ignition temperature (480° C.) of $H_2$ and $O_2$ or higher at least, there is a possibility that reaction itself is not carried out and thus, it is considered that the processing temperature must be 500° C. or higher. If the processing temperature exceeds 950° C., it is considered that strength of a quartz reaction tube is not enough at high temperature and under reduced pressure. From these facts, it is considered that the processing temperature is preferably 500° C. or higher and 950° C. or lower. The processing pressure must be reduced if importance is attached to consistency, and must be increased if importance is attached to growing speed. If both the growing speed and consistency are taken into consideration, it is considered that the pressure is preferably in a range of some Pa or higher and 1000 Pa or lower.

A preferable flow rate of $H_2$ is in a range of 10 sccm to 2000 sccm, and a preferable flow rate of $O_2$ is in a range of 20 sccm to 5000 sccm.

A preferable ratio of $H_2/O_2$ flow rate is 0.1 to 0.5. The speed at the initial oxidation stage becomes extremely fact due to reaction species such as ion, and as the consistency of $H_2$ is higher, the growing speed becomes faster, but if the growing speed becomes faster, it is preferable that the $H_2$ concentration is set lower and oxygen is set to rich ($H_2$ flow rate<$O_2$ flow rate). It is considered that a ratio of $H_2/O_2$ flow rate is up to about 50% under present circumstances, and it is considered that the ratio is preferably in a range of 10% to 50% (0.1 to 0.5). If the ratio of $H_2/O_2$ flow rate exceeds 0.5, practical consistency can not be obtained.

In the present invention, it is considered that $H_2$ is consumed in the following manner. That is, $H_2$ and $O_2$ are supplied, and if they are heated to a temperature equal to or higher than the ignition temperature under normal pressure, they are burned and as a result, $H_2O$ is generated and heat of reaction is generated. The present inventors carried out an experiment, but $H_2O$ could not be observed by Q-MASS (quadrupole mass spectrometry) of exhaust gas in reduced-pressure oxidation, and local temperature rise in the reaction chamber could not be seen. From these facts, it is considered that $H_2O$ is not formed in the reaction chamber and $O_2$ and $H_2$ are basically exhausted. Thus, it is assumed that reaction species such as ion is produced by reaction between oxygen and hydrogen in the pressure-reduced reaction chamber, accelerated oxidation is carried out by the reaction species, and they are swiftly returned to $H_2$ and $O_2$ by the exhaust.

In the present invention, even if only $O_2$ is allowed to flow like the dry oxidation or $H_2O$ is allowed to flow like the wet oxidation, acceleration of oxidation like the present invention is not generated. Therefore, it is considered that reaction species such as ion having higher reactivity than $O_2$ and $H_2O$ is extremely effective for oxidation. When $H_2$ is allowed to flow, it is considered that reaction species having higher reactivity than $O_2$ and $H_2O$ are formed in an inducing manner.

In the present invention, if corresponding $H_2$ is half-way supplied to a region where a plurality of substrates exist, it is considered that the following effects can be obtained:

(1) it is possible to compensate for $H_2$ which is consumed during the process and depleted.

(2) It is possible to supply $H_2$ directly to the substrate arrangement region, and water ($H_2O$) is not easily generated during half-way procedure (if a large quantity of $H_2$ is allowed to flow from one upstream portion, water ($H_2O$) is prone to be produced).

(3) It is possible to bump $H_2$ against $O_2$, and reaction species such as ion is prone to be produced.

The entire disclosure of Japanese Patent Application No. 2003-301982 filed on Aug. 26, 2003 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

INDUSTRIAL APPLICABILITY

As explained above, according to the preferred embodiments of the present invention, it is possible to largely reduce a difference in growing speed of oxide film on silicon surfaces of different surface orientations on silicon substrates formed during the process step of various semiconductor wafers as compared with the conventional oxidation method. When a plurality of substrates are to be processed by a batch type vertical apparatus, it is possible to suppress variation in oxide film thickness caused by variation of hydrogen concentration on each substrate, and it is possible to produce a high quality semiconductor device.

As a result, the present invention can especially suitably be utilized for a producing method of a semiconductor device using a semiconductor silicon wafer, and for a substrate processing apparatus suitably used for the method.

The invention claimed is:

1. A producing method of a semiconductor device, comprising:
    transferring a plurality of substrates into a processing chamber;
    supplying, in a state in which pressure in the processing chamber is lower than atmospheric pressure, oxygen-containing gas and hydrogen-containing gas into the processing chamber which is in a heated state to process the plurality of substrates by oxidation; and
    transferring the plurality of the oxidation-processed substrates out from the processing chamber, wherein
    the hydrogen-containing gas is supplied from a plurality of locations of a region corresponding to a substrate arrangement region in which the plurality of substrates are arranged in the processing chamber,
    wherein flow rates of the hydrogen-containing gas supplied from the plurality of locations are different from each other.

2. A producing method of a semiconductor device, as recited in claim 1, wherein the hydrogen-containing gas is supplied through a porous nozzle provided at a side surface thereof with at least two holes.

3. A producing method of a semiconductor device as recited in claim 1, wherein
    the oxygen-containing gas is at least one of gases selected from the group consisting of oxygen gas and nitrous oxide gas, and the hydrogen-containing gas is at least one of gases selected from the group consisting of hydrogen gas, ammonia gas and methane gas.

4. A producing method of a semiconductor device as recited in claim 1, wherein
    a surface of said substrate includes different crystal orientation planes, or includes polycrystalline silicon or silicon nitride.

5. A producing method of a semiconductor device as recited in claim 1, wherein
    a flow rate of the oxygen-containing gas is larger than that of the hydrogen-containing gas.

6. A producing method of a semiconductor device as recited in claim 1, wherein
    in the oxidation-processing, a processing temperature is 500-1000° C. and a processing pressure is 1-1000 Pa.

7. A producing method of a semiconductor device as recited in claim 1, wherein
    in the oxidation-processing, in a state in which the pressure in the processing chamber is lower than atmospheric pressure, the oxygen-containing gas and the hydrogen-containing gas are reacted with each other in the processing chamber which is in a heated state to generate reaction species, and the plurality of substrates are processed by oxidation with the reaction species.

8. A producing method of a semiconductor device, comprising,
    transferring a plurality of substrates into a processing chamber;
    supplying, in a state in which pressure in the processing chamber is lower than atmospheric pressure, oxygen-containing gas and hydrogen-containing gas into the processing chamber which is in a heated state to process the plurality of substrates by oxidation; and
    transferring the plurality of the oxidation-processed substrates out from the processing chamber, wherein
    the hydrogen-containing gas is supplied from a plurality of locations of a region corresponding to a substrate arrangement region in which the plurality of substrates are arranged in the processing chamber,
    wherein the hydrogen-containing gas is supplied through a plurality of independent nozzles having different lengths.

9. A producing method of a semiconductor device as recited in claim 8, wherein
    in the oxidation processing, in a state in which the pressure in the processing chamber is lower than atmospheric pressure, the oxygen-containing gas and the hydrogen-containing gas are reacted with each other in the processing chamber which is in a heated state to generate reaction species, and the plurality of substrates are processed by oxidation with the reaction species.

10. A substrate processing apparatus, comprising:
    a processing chamber which processes a plurality of substrates;
    a heating source which heats an inside of the processing chamber;
    a holding tool which holds the plurality of substrates in the processing chamber;
    an oxygen-containing gas supply line which supplies oxygen-containing gas into the processing chamber;
    a hydrogen-containing gas supply line which supplies hydrogen-containing gas into the processing chamber from a plurality of locations of a region corresponding to a substrate arrangement region in which the plurality of substrates are arranged in the processing chamber;

an exhaust line which exhausts gas supplied into the processing chamber;

a pressure control device which controls pressure in the processing chamber; and a control device which controls the pressure control device, the heating source, the oxygen-containing gas supply line and the hydrogen-containing gas supply line such that, in a state in which the pressure in the processing chamber is lower than atmospheric pressure, the oxygen-containing gas and the hydrogen-containing gas are supplied into the processing chamber which is in a heated state to process the plurality of substrates by oxidation, wherein the hydrogen-containing gas supply line includes a plurality of independent nozzles having different lengths.

11. A substrate processing apparatus as recited in claim 10, wherein the hydrogen-containing gas supply line includes a plurality of independent supply lines, the supply lines respectively includes mass flow controllers, and the control device controls each of the mass flow controllers such that flow rates of the hydrogen-containing gas supplied from the plurality of supply locations are different from each other.

12. A substrate processing apparatus as recited in claim 10, wherein the hydrogen-containing gas supply line includes a porous nozzle provided at a side surface thereof with at least two holes.

13. A substrate processing apparatus as recited in claim 10, wherein the oxygen-containing gas is at least one of gases selected from the group consisting of oxygen gas and nitrous oxide gas, and the hydrogen-containing gas is at least one of gases selected from the group consisting of hydrogen gas, ammonia gas and methane gas.

14. A substrate processing apparatus as recited in claim 10, wherein the control device controls the oxygen-containing gas supply line and the hydrogen-containing gas supply line such that a flow rate of the oxygen-containing gas is larger than that of the hydrogen-containing gas.

15. A substrate processing apparatus as recited in claim 10, wherein the control device controls the heating source and the pressure control device such that a processing temperature is 500-1000° C. and a processing pressure is 1-1000 Pa.

16. A substrate processing apparatus as recited in claim 10, wherein the control device which controls the pressure control device, the heating source, the oxygen-containing gas supply line and the hydrogen-containing gas supply line such that, in a state in which the pressure in the processing chamber is lower than atmospheric pressure, the oxygen-containing gas and the hydrogen-containing gas are supplied into the processing chamber which is in a heated state so that the oxygen-containing gas and the hydrogen containing gas are reacted with each other in the processing chamber to generate reaction species, and the plurality of substrates are processed by oxidation with the reaction species.

17. A processing method of a substrate, comprising:

transferring a plurality of substrates into a processing chamber;

supplying, in a state in which pressure in the processing chamber is lower than atmospheric pressure, oxygen-containing gas and hydrogen-containing gas into the processing chamber which is in a heated state to process the plurality of substrates by oxidation; and transferring the plurality of the oxidation-processed substrates out from the processing chamber, wherein the hydrogen-containing gas is supplied from a plurality of locations of a region corresponding to a substrate arrangement region in which the plurality of substrates are arranged in the processing chamber, wherein flow rates of the hydrogen-containing gas supplied from the plurality of locations are different from each other.

18. A processing method of a substrate, comprising:

transferring a plurality of substrates into a processing chamber;

supplying, in a state in which pressure in the processing chamber is lower than atmospheric pressure, oxygen-containing gas and hydrogen-containing as into the processing chamber which is in a heated state to process the plurality of substrates by oxidation; and transferring the plurality of the oxidation-processed substrates out from the processing chamber, wherein the hydrogen-containing gas is supplied from a plurality of locations of a region corresponding to a substrate arrangement region in which the plurality of substrates are arranged in the processing chamber, wherein the hydrogen-containing gas is supplied through a plurality of independent nozzles having different lengths.

* * * * *